(12) United States Patent
Furutani et al.

(10) Patent No.: US 9,093,222 B2
(45) Date of Patent: Jul. 28, 2015

(54) DYE ADSORPTION APPARATUS AND DYE ADSORPTION METHOD

(75) Inventors: Goro Furutani, Koshi (JP); Takashi Terada, Kumamoto (JP); Yoshiteru Fukuda, Kumamoto (JP); Norio Wada, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 179 days.

(21) Appl. No.: 13/989,151

(22) PCT Filed: Sep. 27, 2011

(86) PCT No.: PCT/JP2011/005415
§ 371 (c)(1),
(2), (4) Date: Aug. 13, 2013

(87) PCT Pub. No.: WO2012/070176
PCT Pub. Date: May 31, 2012

(65) Prior Publication Data
US 2013/0316485 A1 Nov. 28, 2013

(30) Foreign Application Priority Data
Nov. 25, 2010 (JP) ................................. 2010-262344

(51) Int. Cl.
| | |
|---|---|
| B05C 3/00 | (2006.01) |
| H01G 9/20 | (2006.01) |
| H01L 21/67 | (2006.01) |
| H01L 21/677 | (2006.01) |

(52) U.S. Cl.
CPC ............ *H01G 9/20* (2013.01); *H01L 21/67057* (2013.01); *H01L 21/67086* (2013.01); *H01L 21/67757* (2013.01); *H01G 9/2059* (2013.01); *Y02E 10/542* (2013.01)

(58) Field of Classification Search
CPC .......... H01L 2924/00014; H01L 2224/45099; H01L 21/02; H01L 33/44
USPC ...................... 257/E31.003; 438/98, 57, 758; 118/260, 300, 325, 407, 423
See application file for complete search history.

(56) References Cited

U.S. PATENT DOCUMENTS

2001/0004901 A1    6/2001    Yamanaka et al.

FOREIGN PATENT DOCUMENTS

| JP | 2001-185244 A | 7/2001 |
| JP | 2006-244954 A | 9/2006 |
| WO | 2010-098088 A | 9/2010 |
| WO | 2011-105089 A | 9/2011 |

OTHER PUBLICATIONS

International Search Report issued on Nov. 8, 2011 for WO2012/070176A1.

*Primary Examiner* — Mark A Laurenzi
(74) *Attorney, Agent, or Firm* — Abelman, Frayne & Schwab

(57) ABSTRACT

Provided is a dye adsorption unit including a processing tank of which the upper surface is opened, in order to perform a batch dye adsorption process for a predetermined number of substrates. The dye adsorption unit further includes, as a moving system around the processing tank, a boat capable of going in and out of the processing tank from the upper opening, a boat transport unit that serves for the boat to go in and out of the processing tank, and a top cover for detachably closing the upper opening. Further, the dye adsorption unit includes a dye solution supply unit for supplying the dye solution into the processing tank, and a flow control unit for controlling the flow of the dye solution in the processing tank during the dye adsorption processing.

20 Claims, 28 Drawing Sheets

DYE ADSORPTION APPARATUS AND DYE ADSORPTION METHOD

CROSS REFERENCE TO RELATED APPLICATIONS

This application is a national phase of PCT application No. PCT/JP2011/005415, filed on 27 Sep. 2011, which claims priority to Japanese patent application No. 2010-262344, filed on 25 Nov. 2010, all of which are incorporated herein by reference.

TECHNICAL FIELD

The present invention relates to a dye adsorption apparatus and a dye adsorption method for adsorbing dye into a porous semiconductor layer formed on a surface to be treated ("treated surface") of a substrate.

BACKGROUND

Recently, a dye sensitization solar cell has been considered as promising as a future inexpensive solar cell. As illustrated in FIG. 20, a dye sensitization solar cell includes, as a basic structure, a porous semiconductor layer 204 impregnated with a sensitizing dye and an electrolyte layer 206 between a transparent electrode (negative electrode) 200 and a counter electrode (positive electrode) 202.

Here, the semiconductor layer 204 is divided into a plurality of cells together with the transparent electrode 200, the electrolyte layer 206, and the counter electrode 202, and formed on a transparent substrate 208 in which the transparent electrode 200 is interposed between the semiconductor layer 204 and the transparent substrate 208. The rear surface side of the counter electrode 202 is covered by a counter substrate 210. The transparent electrode 200 of each cell is electrically connected with a neighboring counter electrode 202 and the plurality of cells are electrically connected with each other either in series or in parallel in an entire module.

In the dye sensitization solar cell configured as described above, when visible light is illuminated from the rear side of the transparent substrate 208, the dye impregnated in the semiconductor layer 204 is excited to emit electrons. The emitted electrons are guided to the transparent electrode 200 through the semiconductor layer 204 and then emitted to the outside. The emitted electrons return to the counter electrode 202 via an external circuit (not illustrated) and are received in the dye in the semiconductor layer 204 again via the ions in the electrolyte layer 206. In this manner, optical energy is immediately converted into electric power which is in turn output.

In a process of fabricating such a dye sensitization solar cell, a method of immersing the porous semiconductor layer 204 formed on the transparent substrate 208 in a dye solution so as to adsorb sensitizing dye into the porous semiconductor layer 204 has been employed in the related art.

PRIOR ART DOCUMENT

Patent Document

Patent Document 1: Japanese Patent Laid-Open Publication No. 2006-244954

DISCLOSURE OF THE INVENTION

Problem to be Solved by the Invention

The above-described immersing method requires at least scores of hours in the dye adsorption processing which may vary depending on the types of dye and thus, becomes the cause of rate-determining of tact of the entire steps in the process of fabricating a dye sensitization solar cell and decreasing manufacturing efficiency. In connection with this problem, it may be considered to operate a plurality of immersion type dye adsorption devices in parallel which requires at least scores of dye adsorption devices to be prepared and thus, is not practical.

The present invention has been made to solve the problems of the related art as described above and provides a dye adsorption apparatus and a dye adsorption method capable of significantly reducing the amount of processing time in a step of adsorbing dye into a porous semiconductor layer formed on a treated surface of a substrate.

Means to Solve the Problems

The dye adsorption in a first viewpoint of the present invention is a dye adsorption apparatus of adsorbing dye into a porous semiconductor layer formed on a treated surface of a substrate. The dye adsorption apparatus includes: a boat configured to detachably hold a plurality of substrates which are arranged in a row such that the treated surfaces of the substrates face horizontally; a processing tank configured to accommodate the boat and the plurality of substrates held in the boat to be capable of going in and out of the processing tank through a top opening; a top cover configured to close the top opening of the processing tank; a first transport unit configured to transport the boat into and out of the processing tank; a dye solution supply unit configured to supply a dye solution formed by solving the dye in a solvent into the processing tank to such an extent that the plurality of substrates held in the boat are sunk in the dye solution within the processing tank; and a flow control unit configured to control a flow of the dye solution within the processing tank during a dye adsorption processing.

In the dye adsorption apparatus of the first viewpoint, a batch type dye adsorption processing is performed for a plurality of substrates in the processing tank. During the processing, a flow of dye solution is formed within the processing tank in a state where the top opening of the processing tank is closed by the top cover and the treated surfaces of the substrates are exposed to the flow of the dye solution of high pressure. Thus, aggregation or cohesion of dye is hardly caused on a surface layer portion of the porous semiconductor layer on the treated surface of each of the substrates, the dye efficiently penetrates into the inside of the porous semiconductor layer, and thus, the dye adsorption into the porous semiconductor layer may proceed at high speed.

According to an aspect of the present invention, the processing tank is provided with at least one first port and at least one second port, the dye solution supply unit supplies the dye solution to the processing tank using at least one of the first port and the second port, and the flow control unit controls the flow of the dye solution using the first port and the second port. In such a case, the flow control unit which may be properly employed is a type that circulates the dye solution between the inside and outside of the processing tank, or a type that controls the flow of the dye solution while substituting old dye solution with new dye solution within the processing tank using the first port and the second port. Further, it is also possible that the dye solution supply unit substitutes old dye solution to new dye solution within the processing tank using the first port and the second port.

In an additional aspect of the present invention, the processing tank is further provided with a third port for use in discharging the dye solution, the dye solution supply unit substitutes old dye solution with new dye solution within the processing tank using at least one of the first port and the second port, and the third port, and the flow control unit controls the flow of the dye solution while substituting old dye solution with new dye solution within the processing tank using at least one of the first port and the second port and the third port. In such a case, the flow control unit which may be employed is a type that, during the dye adsorption processing, switches or varies the flow direction of the dye solution, a type that, during the dye adsorption processing, varies the flow rate of the dye solution, or a type that, during the dye adsorption processing, the flow control unit varies the pressure within the processing tank.

In an additional aspect of the present invention, a substrate support unit configured to contact with and support the rear surface of each of the substrates independently from the boat is provided within the processing tank.

In a preferred aspect, the substrate support unit includes a plurality of support members which are arranged in a row with a spacing corresponding to that of the plurality of substrates arranged in a row and held on the boat, and provided in the processing tank, and each support member may contact with the rear surface of a substrate corresponding to the support member by a rod-shaped or plate-shaped body protrusion which extends upward from the bottom of the processing tank.

In an additional aspect, the substrate support unit includes a plurality of support members which are arranged in a row with a spacing corresponding to that of the plurality of substrates arranged in a row and held on the boat, and provided on the top cover, and each support member may be contacted with the rear surface of a substrate corresponding to the support member by a rod-shaped or plate-shaped body protrusion which extends downward from the bottom surface of the top cover.

Since the plurality of substrates which are subject to a batch type dye adsorption processing in the processing tank are supported by the support members provided in the processing tank and/or on the top cover on the rear surfaces thereof, the substrates are rarely flexed or inclined by the pressure applied in the flow of the dye solution. Thus, the damage or deformation of the substrates may be avoided. In addition, when the protrusions of the support members are contacted with the rear surfaces of the substrate, the contact type may be plane contact, line contact or point contact. With any contact type, the treated surfaces of the substrates do not undergo any influences.

In addition, as described above, the protrusions of the support members may maintain the posture of the substrates stably within the processing tank. Further, the protrusions of the support members may suppress the flow of the dye solution along the rear surfaces of the substrates, and as reflective effects thereof, the protrusions may facilitate the flow of the solution along the front surfaces (treated surfaces) of the substrates and further enhance the dye adsorption efficiency.

Each of the support members which may be employed is a type that contacts with and supports one substrate. Alternatively, in order to increase the space efficiency within the processing tank, a configuration may be properly employed in which a plurality of substrates are arranged in a row on the boat such that the treated surfaces of each pair of adjacent substrates are directed in the opposite directions and each of the support members may contact with and support adjacent substrates of the pair.

In an additional aspect of the present invention, a flow suppressing section is provided to suppress the flow of the dye solution along the rear surface of each of the substrates within the processing tank. Preferably, the flow suppressing section includes a plurality of flow suppressing members which are arranged in a row with a spacing corresponding to that of the plurality of substrates arranged in a row and held on the boat, and provided in the processing tank, and each flow suppressing member suppresses the flow of the dye solution along the rear surface of a substrate corresponding to the flow suppressing member.

According to an aspect of the present invention, the first transport unit includes an arm detachably coupled to the boat, and the arm breaks away from the arm while the boat is being accommodated in the processing tank together with the plurality of substrates for a dye adsorption processing. When the boat is transported in the outside of the processing tank, or transported into or out of the processing tank, the arm is coupled to the boat.

According to an additional aspect, the first transport unit includes an arm integrally coupled to the boat and the top cover is fixed to the arm. The top cover closes the top opening of the processing tank the arm while the boat is being accommodated in the processing tank together with the plurality of substrates for the dye adsorption processing. In addition, when the plurality of substrates are loaded on or unloaded from the boat in the outside of the processing tank, the top cover fastening unit is released and the top cover is retracted on the arm or separated from the top cover.

A dye adsorption apparatus of a second viewpoint of the present invention is a dye adsorption apparatus of adsorbing a dye into a porous semiconductor layer formed on a treated surface of a substrate. The dye adsorption apparatus includes: a processing tank configured to accommodate a plurality of substrates which are arranged in a row such that the treated surfaces thereof are parallel to each other; a top cover configured to close a top opening of the tank; a first transport unit configured to transport the plurality of substrates into or out of the processing tank; and a dye solution supply unit configured to supply a dye solution formed by solving the dye in a solvent into the processing tank to such an extent that the plurality of substrates held in the boat are sunk in the dye solution within the processing tank. During a dye solution processing, the flow direction of the dye solution within the processing tank is switched by the dye solution unit.

A dye adsorption apparatus in a third viewpoint of the present invention is a dye adsorption apparatus of adsorbing a dye into a porous semiconductor layer formed on a treated surface of a substrate. The dye adsorption apparatus includes: a processing tank configured to accommodate a plurality of substrates which are arranged in a row such that the treated surfaces thereof are parallel to each other; a top cover configured to close a top opening of the processing tank; a first transport unit configured to transport the plurality of substrates into and out of the processing tank; a dye solution supply unit configured to supply a dye solution formed by solving the dye in a solvent into the processing tank to such an extent that the plurality of substrates held in the boat are sunk in the dye solution within the processing tank; and a flow control unit configured to switch a flow direction of the dye solution within the processing tank during a dye adsorption processing.

In the dye adsorption apparatus of the second or third viewpoint, a batch type dye adsorption processing is performed for a plurality of substrates in the processing tank. During the processing, the flow of the dye solution is formed in the processing tank in a state where the top opening of the processing tank is closed, and the treated surfaces of the substrates are exposed in the flow of the dye solution of high pressure. Thus, aggregation or cohesion of the dye is hardly caused on a surface layer portion of the porous semiconductor layer on the treated surface of each of the substrates, the dye efficiently penetrates into the porous semiconductor layer, and thus the dye adsorption into the porous semiconductor layer may proceed at high speed. Further, as the flow direction of the dye solution within the processing tank is switched within the tank during the processing, the penetration of the dye solution into the treated surface of each of the substrates may be facilitated and the processing time may be significantly shortened.

Further, a dye sorption method according to the present invention is a dye adsorption method of adsorbing a dye into a porous semiconductor layer formed on a treated surface of a substrate. The dye adsorption method includes: a first step of arranging a plurality of substrates in a row such that the treated surfaces thereof are parallel to each other to be accommodated in the processing tank; a second step of supplying a dye solution formed by solving the dye in a solvent into the processing tank in a first direction parallel to the treated surfaces; and a third step of switching to a second direction which is different from the first direction and parallel to the treated surfaces and supplying the dye solution.

In the dye adsorption method of the present invention, a batch type dye adsorption processing is performed for a plurality of substrates within the processing tank. As the flow direction of the dye solution within the processing tank is switched within the tank during the processing, the penetration of the dye solution into the treated surface of each of the substrates may be facilitated and the processing time may be significantly shortened.

Effect of the Invention

According to the dye adsorption apparatus or dye adsorption method according to the present invention, the processing time of a step of adsorbing a dye into a porous semiconductor layer may be significantly reduced by the configurations and actions as described above.

DETAILED DESCRIPTION TO EXECUTE THE INVENTION

Hereinbelow, exemplary embodiments of the present invention will be described with reference to FIGS. 1 to 19.

[Configuration of Entire System]

Figure 1:
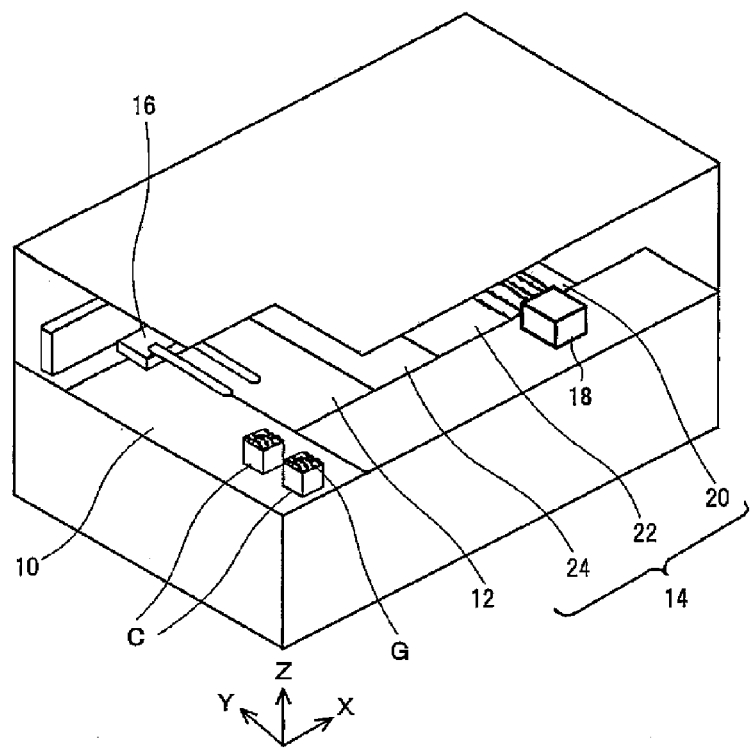
FIG. 1 is a perspective view illustrating the entire configuration of a dye adsorption processing system which includes a dye adsorption apparatus of an exemplary embodiment of the present invention.
Figure 2:
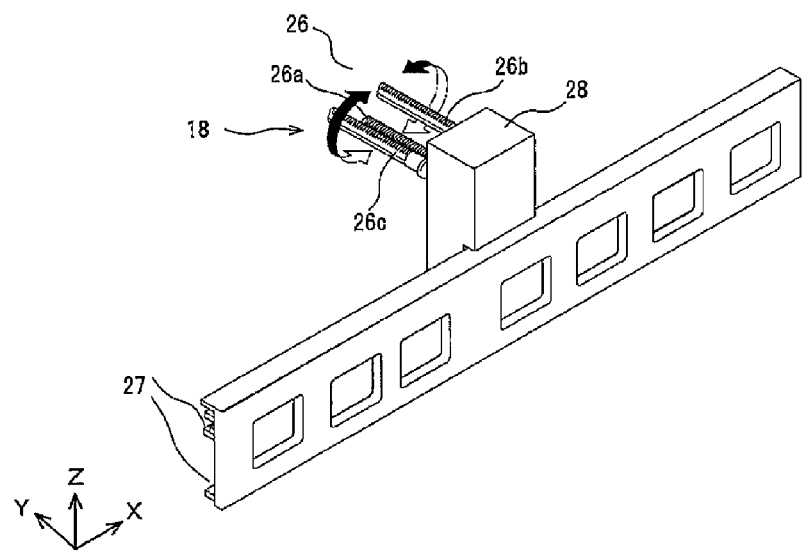
FIG. 2 is a perspective view illustrating a configuration of a transport mechanism configured to transport substrates between processing units in the dye adsorption processing system of FIG. 1.

FIGS. 1 and 2 illustrate the entire configuration of the dye adsorption processing system in which a dye adsorption apparatus of an exemplary embodiment of the present invention is included.

Figure 20:
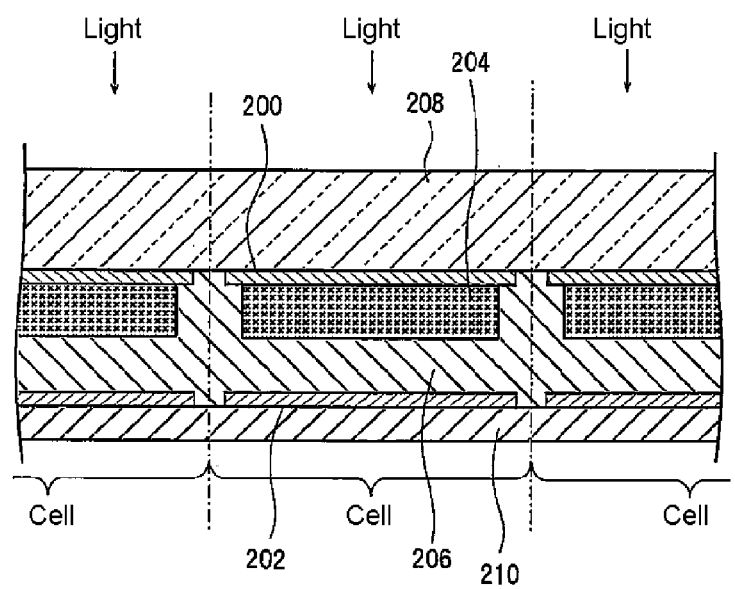
FIG. 20 is a longitudinal sectional view illustrating a basic structure of a dye sensitization solar cell.

The dye adsorption processing system may be used, for example, in a step of adsorbing a sensitizing dye into a porous semiconductor layer in a process of fabricating a dye sensitization solar cell. In such a case, a transparent substrate 208, which is formed with a transparent electrode 200 and a porous semiconductor layer 204 before counterpart members (a counter electrode 202, a counter substrate 210, and an electrolyte layer 206) are combined (FIG. 20), will be a substrate to be treated G in the dye adsorption device. In addition, in the substrate G, the surface formed with the semiconductor layer 204 will be a surface to be treated ("treated surface") or a front surface $G_s$.

Here, the transparent substrate 208 is made up of, for example, a transparent inorganic material such as, for example, quartz or glass, or a transparent plastic material such as, for example, polyester, acryl or polyimide. The transparent electrode 200 is made up of, for example, fluorine doped $SnO_2$ (FTO) or indium-tin oxide (ITO). In addition, the porous semiconductor layer 204 may be made up of, for example, a metal oxide such as, for example, $TiO_2$, ZnO or $SnO_2$. The substrate G has a predetermined shape (e.g., a quadrilateral shape) and a predetermined size. A predetermined number of substrates (e.g., 25 substrates) may be carried into/carried out of the dye adsorption processing system by a transport vehicle or a transport robot (not illustrated) in a state where the substrates are accommodated in cassettes C.

As illustrated in FIG. 1, the dye adsorption processing system includes a cassette carrying-in/carrying-out section 10 where carrying-in/carrying-out of the cassettes C is performed, a loader/unloader section 12 where non-treated substrates G are taken out from the cassettes C and treatment completed substrates G are accommodated in the cassettes C, and a processing section 14 where a batch type dye adsorption processing and a batch type post-processing (rinse and dry) for substrates G are performed.

Between the carrying-in/carrying-out section 10 and the loader/unloader section 12, a cassette C in which non-treated substrates G are accommodated is transferred from the cassette carrying-in/carrying-out section 10 to the loader/unloader section 12, and a cassette C in which the treatment completed substrates G are accommodated is transferred from the loader/unloader section 12 to the cassette carrying-in/carrying-out section 10 by a conveyance arm 16. In the loader/unloader section 12, the movement of the substrates G between the transport device 18 in the processing section 14 and a cassette C is performed by a predetermined number of substrates G (e.g., 50 substrates).

In the processing section 14, the dye adsorption unit (dye adsorption apparatus) 20, the rinse unit 22 and the dry unit are 24 are arranged in a row in one horizontal direction (in the X direction). As illustrated in FIG. 2, the transport device 18 includes: a chuck unit 26 configured to arrange the predetermined number of substrates G (e.g., 50 substrates) horizontally in a row and to detachably grasp substrates G, and a transport driving unit 28 configured to horizontally move along rails 27 extending in the unit arranging direction (in the X direction) in the processing section 14 and to drive and operate the chuck unit 26 on each of the units 20, 22, 24.

The chuck unit 26 of the transport device 18 includes three parallel chuck arms 26a, 26b, 26c extending in the horizontal direction. Among them, the fixed low chuck arm 26a at the center holds the bottom side edge of each of the substrate G by holding recesses formed in a row on the top surface thereof. A pair of left and right movable chuck arms 26b, 26c are configured to be movable to open/close while tracing a circular arc in an outer circumference and to hold the left and right side edges of each of the substrates G by holding grooves formed in a row on the inner surfaces thereof, respectively.

[Configuration of Dye Adsorption Unit]

Figure 3:
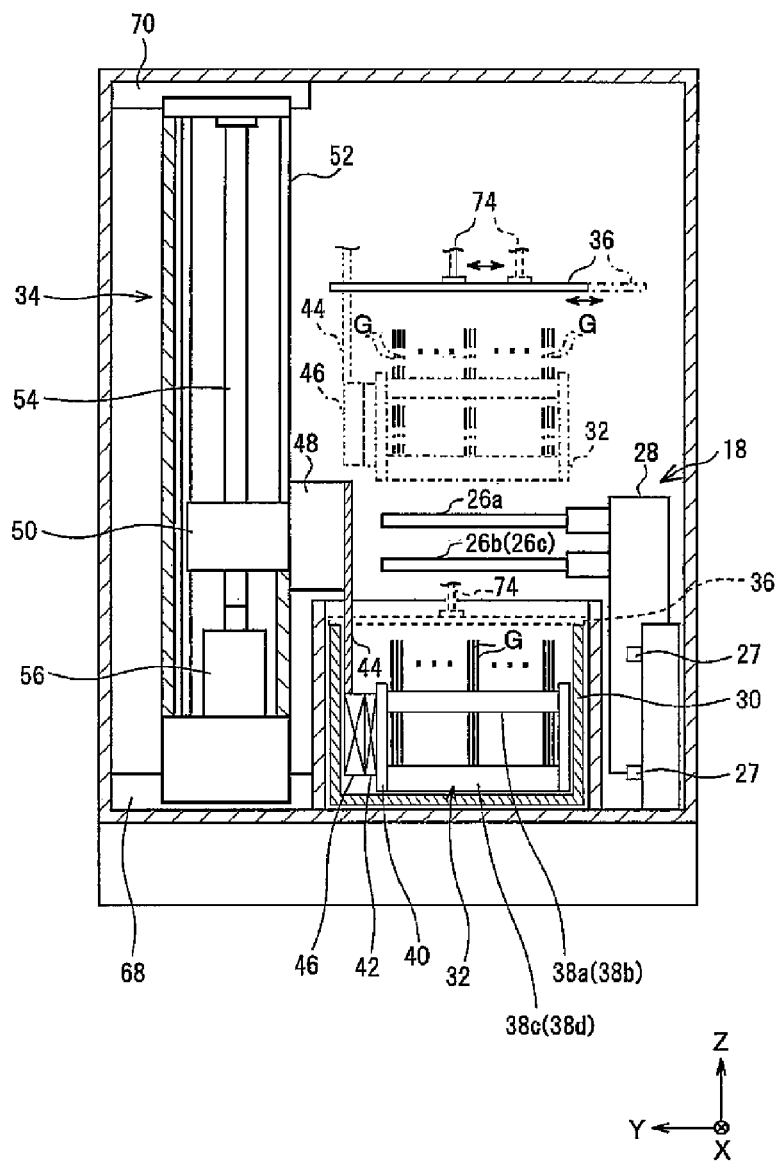
FIG. 3 is a longitudinal sectional view illustrating a configuration of a dye adsorption unit of an exemplary embodiment.
Figure 4:
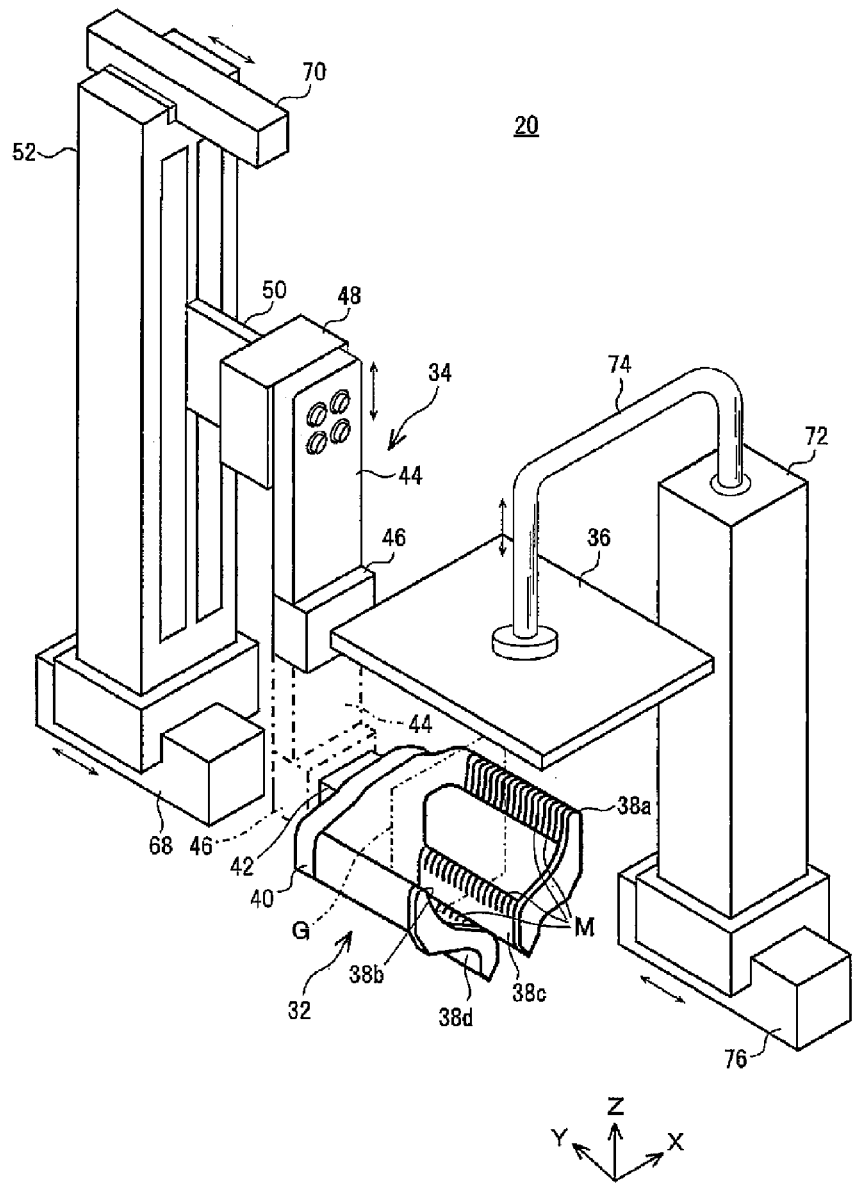
FIG. 4 is a perspective view illustrating a configuration of a moving system in the dye adsorption unit.

FIGS. 3 and 4 illustrate a configuration of a moving system in the dye adsorption unit 20 in the present exemplary embodiment. The dye adsorption unit 20 includes a processing tank 30 of which the top surface is opened as illustrated in FIG. 3 in order to perform a batch type dye adsorption processing for a predetermined number of substrates G (in the present exemplary embodiment, 50 substrates), and includes, as a moving system around the processing tank 30, a boat 32 configured to be capable of going in and out of the processing tank 30 through the top opening, a boat transport unit 34 configured to transport the boat 32 into and out of the processing tank 30, and a top cover 36 configured to detachably close the top opening of the processing tank 30.

As illustrated in FIG. 4, the boat 32 includes four parallel rod-shaped (or plate-shaped) holding units 38a, 38b, 38c, 38d extending in the horizontal direction and spaced apart from each other vertically and horizontally. The holding units 38a, 38b, 38c, 38d are formed, on the inner surface or top surface, with a plurality of holding grooves (M) (e.g., 50 grooves) configured to arrange a predetermined number of substrates G (e.g., 50 substrates) horizontally in a row and to detachably hold the substrates G. More specifically, the upper holding units 38a, 38b of left and right sides hold the left and right side edges of the substrates by the holding grooves M formed in a row on the inner surfaces thereof. In addition, the lower holding units 38c, 38d of the left and right sides are configured to hold the lower side edges of the substrates G by the holding grooves M formed in a row on the top surfaces thereof.

In the present exemplary embodiment, in the predetermined number of substrates G arranged horizontally in a row on the chuck unit 26 of the transport device 18 and further on the boat 32, the direction of the treated surface $G_s$ of each of odd-numbered substrates G and the direction of the treated surface $G_s$ of even-numbered surface are opposite to each other. Thus, the treated surfaces $G_s$, $G_s$ of a pair of adjacent (odd-numbered and even-numbered) substrates G, G are directed to the opposite directions, i.e. the rear surfaces of the substrates G, G face each other.

In the opposite side when viewed from the transport device 18, the ends of the holding unit 38a, 38b, 38c, 38d of the boat 32 are integrally connected with each other by a support plate 40, and a permanent magnet 42 is attached to the rear surface of the support plate 40. Meanwhile, an electromagnet 46 is attached to the lower end of a lift arm 44 of the boat transport unit 34 which extends vertically. When electric current is applied to the electromagnet 46 by an excitation circuit (not illustrated) to excite the electromagnet 46, the permanent magnet 42 is attracted to the electromagnet 46 by electromagnetic force so that the boat 32 is integrally coupled to the lift arm 44. Also, when the excitation of the electromagnet 46 is stopped, the lift arm 44 may be separated from the boat 32.

The lift arm 44 is coupled to a lift shaft 54 of a lift tower 52 through an arm support unit or operating unit 48 of a rectangular parallelepiped shape and a horizontal support member 50. The lift shaft 54 includes, for example, a ball-screw mechanism and is configured to convert the rotational drive force of a motor 56 disposed on the bottom of the lift tower 52 into vertical rectilinear drive force to move the lift arm 52 up and down.

The lift tower 52 is configured to be movable along lower and upper horizontal guide rails 68, 70 extending in parallel to the longitudinal direction of the boat 32, i.e., in the arrangement direction of the substrates G in order to avoid the lift arm 44 from being interfered with the top cover 36 above the processing tank 30. Thus, the lift arm 44 is adapted to be capable of moving between a first position (a working position) where the lift arm 44 may be transported into or out of the processing tank 30 and a second position (a retracted position) where the lift arm is retracted aside from the processing tank 30 or a space above the tank 30.

The top cover 36 has a shape and size corresponding to those of the top opening of the processing tank 30 and is configured to be opened or closed by a top cover operating unit 72 that is installed adjacent to the processing tank 30. The top cover operating unit 72 includes, for example, an air cylinder or a linear actuator and raises and lowers a manipulation rod 74 of a reversed-U shape which is connected to the top cover 36, thereby moving the top cover 36 between a first position (close position) where the top cover 36 is closely contacted with the top opening of the processing tank 30 and a second position (open position) where the top cover 36 is moved upward apart from the top opening of the processing tank 30. Also, the top cover operating unit 72 is configured to be capable of moving away from the boat transport unit 34 side, for example, along a horizontal guide rail 76 extending in parallel to the longitudinal direction of the boat 32 in order to avoid the top cover 36 from being interfered with the lift arm 44 above the processing tank 30 when the boat 32 and the substrates G are transported into or out of the processing tank 30.

Figure 5:
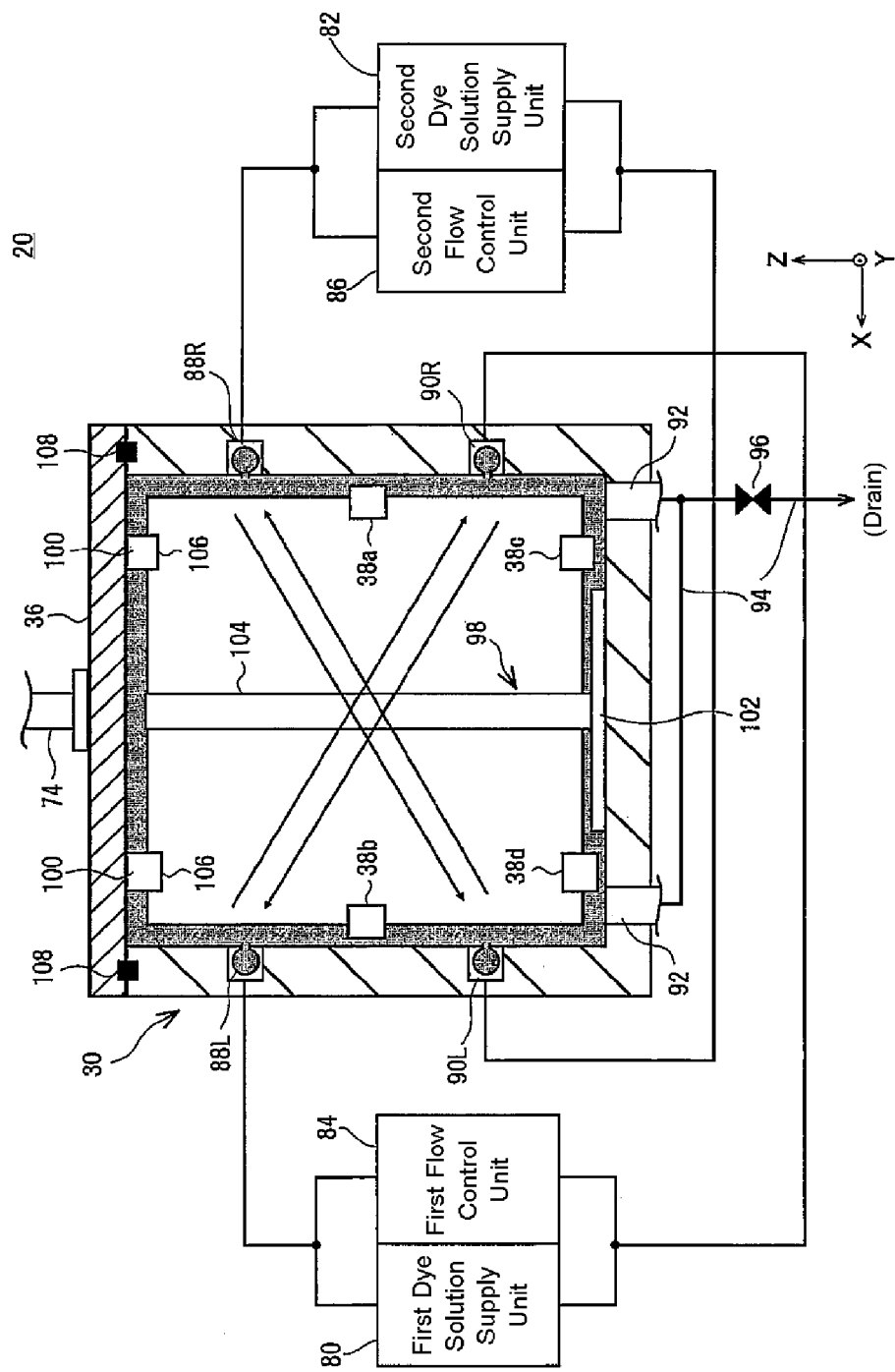
FIG. 5 is a block diagram illustrating a dye solution supply circuit and a flow control circuit in the dye adsorption unit.

FIG. 5 illustrates a dye solution supply circuit and the flow control circuit in the dye adsorption unit 20 in the present exemplary embodiment. In the present exemplary embodiment, first and second dye solution supply units 80, 82 are provided so as to supply dye solution into the processing tank 30 and first and second flow control units 84, 86 are provided so as to control the flow of the dye solution in the processing tank 30.

On the left and right inner walls of the processing tank 30 (a pair of inner walls opposed to each other in the X direction) are provided with left upper and lower ports 88L, 90L and right upper and lower ports 88R, 90R, respectively. Here, the left upper port 88L and the right upper port 88R are installed at a height in the vicinity of the processing tank 30 and extend or are discretely distributed in the longitudinal direction of the processing tank 30 (in the Y direction). In addition, the left lower port 90L and right lower port R are installed at a position at a height in the vicinity of the bottom of the processing tank 30 and extend or are discretely distributed in the longitudinal direction of the processing tank 30 (in the Y direction).

The first dye solution supply unit 80 and the first flow control unit 84 are connected to the left upper port 88L and the right lower port 90R of the processing tank 30. Meanwhile, the second dye solution supply unit 82 and the second flow control unit 86 are connected to the right upper port 88R and the left lower port 90L of the processing tank 30. The specific configurations and actions of the dye solution supply unit 80, 82 and the flow control unit 84, 86 will be described in detail below.

The dye solution used in the dye adsorption unit 20 is formed by solving a sensitizing dye in a solvent with a predetermined concentration. As for the sensitizing dye, for example, a metal complex such as, for example, metal phthalocyanine, or an organic dye such as, for example, a cyanine-based dye or a basic dye may be used. As for the solvent, for example, alcohols, ethers, amides, or a hydrocarbon may be used.

One or more drain ports 92 are formed in the bottom of the processing tank 30. The drain ports 92 are communicated with a drain tank (not illustrated) through a drain pipe 94. An open/close valve 96 is provided on the way of the drain pipe 94.

Figure 6:
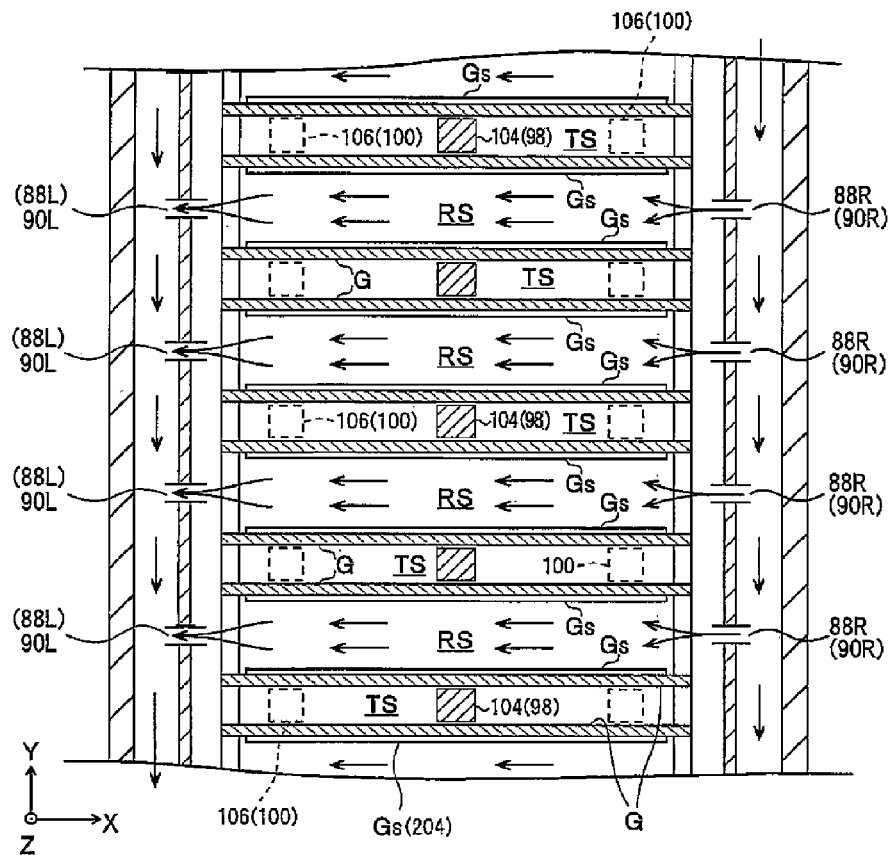
FIG. 6 is a horizontal sectional view illustrating a state in which boards and substrates are accommodated in the processing tank of the dye adsorption unit.

As illustrated in FIGS. 5 and 6, the predetermined number of substrates G which are subject to a batch type dye adsorption processing in the processing tank 30 are held at left and right side edges and bottom side edges by the holding unit 38a, 38b, 38c, 38d of the boat 32 and supported at the rear surfaces and top side edges by the support members 98, 100 provided in the processing tank 30 and on the top cover 36 in a state where the substrates G are arranged in a row with the treated surfaces $G_s$ facing horizontally.

More specifically, a support member 98 of the processing tank 30 includes a horizontal support plate 102 fixed to the bottom of the processing tank 30, and a predetermined number of rod-shaped or plate-shaped body protrusions 104 (e.g., 25 protrusions) extending vertically from the horizontal support plate 102 preferably to a position adjacent to the top opening of the processing tank 30. Here, the body protrusions 104 are arranged in a row in the direction (in the Y direction), which is the same as the arrangement direction of the predetermined number of substrates G (e.g., 50 substrates) which are arranged on the boat 32 horizontally in a row, at a predetermined spacing which corresponds to that of the substrates G.

Figure 7:
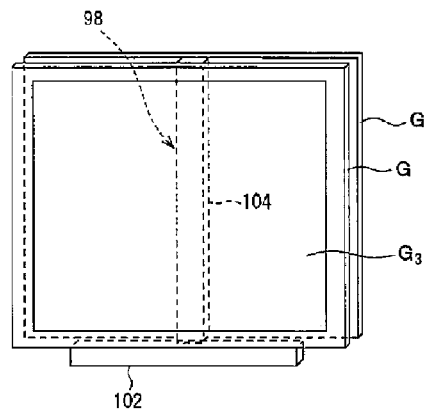
FIG. 7 is a perspective view illustrating a state in which a pair of adjacent substrates of which the rear surfaces face each other are supported by a body protrusion at the rear surface sides thereof within the processing tank.

As described above, the predetermined number of substrates G are arranged in a row on the boat 32 in a state where the treated surfaces $G_s$, $G_s$ of a pair of adjacent substrates G, G are directed to the opposite directions, i.e. the rear surfaces thereof face each other. As illustrated in FIGS. 6 and 7, each of the body protrusions 104 are positioned between the adjacent substrates G, G in the pair such that the rear surfaces thereof face each other, and contacted with each of the rear surfaces of the substrates G, G at the central portion thereof in the widthwise direction of the substrates (in the X direction).

In addition, the support member 100 of the top cover 36 includes a predetermined number of rod-shaped or plate-shaped cover protrusions 106 (e.g., 25 pairs at left and right sides) which extend vertically downward from the bottom surface of the top cover 36. Here, the cover protrusions 106 are arranged in two rows at a predetermined spacing which corresponds to that of the predetermined number of substrates G (50 substrates) arranged horizontally in a row on the boat 32.

In addition, a seal member, for example, an O-ring 108 is attached to the peripheral edge of the bottom surface of the top cover 36 to seal the interior of the processing tank 30 when the top opening of the processing tank 30 is closed by the top cover 36.

As illustrated in FIG. 6, in each pair of substrates G, G, of which the rear surfaces are adjacent to face each other within the processing tank 30, the treated surface $G_s$ of one substrate G of the pair and the treated surface $G_s$ of the neighboring substrate G in the opposite side face each other, and the treated surface $G_s$ of the other substrate G of the pair and the treated surface $G_s$ of the neighboring substrate G in the opposite side also face each other. Like this, between a pair of neighboring substrates G, G, of which the treated surfaces $G_s$, $G_s$ face each other, neither the body protrusions 104 nor the cover protrusions 106 exist, thereby forming a flow passing space RS in which the dye solution may flow freely and smoothly in the widthwise direction of the substrates (in the X direction).

On the contrary, between the adjacent substrates G, G of each pair of which the rear surfaces face each other, the body protrusions 104 and the cover protrusions 106 function as baffles, thereby forming a stay space TS where the dye solution is hard to flow in the widthwise direction of the substrates (in the X direction).

In this manner, within the processing tank 30, a flow passing space RS and stay space TS are alternately formed with a substrate G being between them along the arrangement direction of the substrates G (along the Y direction). Thus, the treated surface $G_S$ of each of the substrates G on the boat 32 faces a flow passing space RS and the rear surface thereof faces the stay space TS.

In the present exemplary embodiment, the discharge openings (or suction openings) of the left ports 88L, 90L and the right ports 88R, 90R are arranged at opposite positions through the flow passing spaces RS, respectively, in the widthwise direction of the substrates (in the X direction). Thus, as described later, for example, when the flow of the dye solution is controlled within the processing tank 30 using the right upper ports 88R and the left lower ports 90L by operating the second flow control unit 86, a large amount of dye solution introduced into the processing tank 30 from the right upper ports 88R flows within each of the flow passing spaces RS along the treated surface $G_S$ of each of the substrates G and arrives at the left lower ports which are the outlets (suction openings).

In the present exemplary embodiment, as illustrated in FIG. 6, in the substrate arrangement direction (in the Y direction), the spacing size of the flow passing spaces RS is set to be relatively large and the spacing size of the stay spaces TS is set to be relatively small. Thus, the penetration efficiency of the dye solution, which flows within the processing tank 30, into the porous semiconductor layer 204 (FIG. 19) formed on the treated surface $G_S$ of each of the substrates G may be further enhanced.

Figure 8:
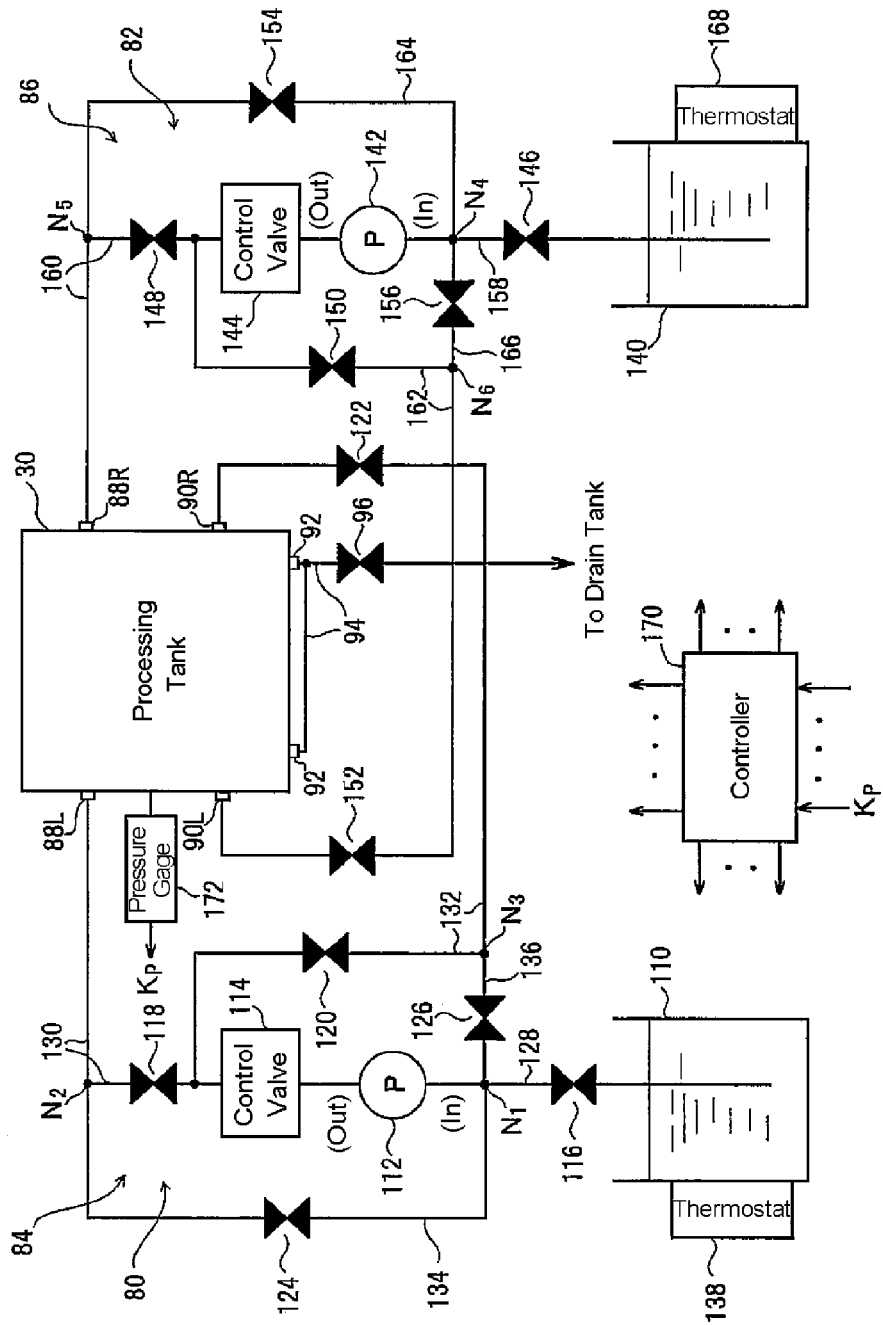
FIG. 8 is a block diagram illustrating a specific exemplary configuration of a dye solution supply circuit and a flow control circuit in the dye adsorption unit.

FIG. 8 illustrates a dye solution supply circuit and a flow control circuit in the dye adsorption unit of the present exemplary embodiment.

The first dye solution supply unit 80 and the first flow control unit 84 share some or all of a first tank 110, a first pump 112, a first control valve 114, a plurality of open/close valves 116, 118, 120, 122, 124, 126 and a plurality of pipes 128, 130, 132, 134, 136. Here, the first tank 110 stores the dye solution for use in a dye adsorption processing. The inlet side of the first pump 112 is connected to the first tank 110 through the pipe 128. An open/close valve 116 is provided on the way of the pipe 128. The outlet side of the first pump 112 is connected to a left upper port 88L of the processing tank 30 through the first control valve 114 and the pipe 130, and connected to the right lower port 90R of the processing tank 30 through the first control valve 114 and the pipe 132.

On the way of the pipe 130, the open/close valve 118 is provided, and on the way of the pipe 132, the open/close valves 120, 122 are provided. The pipe 134 connects a node $N_1$ provided on the pipe 128 between the open/close valve 116 and the inlet side of the pump 112 and the node $N_2$ provided on the pipe 130 between the open/close valve 118 and the left upper port 88L. On the way of the pipe 134, the open/close valve 124 is provided. In addition, the pipe 136 connects the node $N_1$ and a node $N_3$ provided on the pipe 132 between the open/close valves 120, 122. On the way of the pipe 136, the open/close valve 126 is provided. A thermostat 138 is attached to the first tank 110 so as to control the temperature of the dye solution to a temperature suitable for the dye adsorption processing, for example, to 40° C. to 60° C.

Meanwhile, the second dye solution supply unit 82 and the first flow control unit 86 shares some or all of a second tank 140, a second pump 142, a second control valve 144, a plurality of open/close valves 146, 148, 150, 152, 154, 156 and a plurality of pipes 158, 160, 162, 164, 166. Here, the second tank 140 stores the dye solution for use in the dye adsorption processing. The inlet side of the second pump 142 is connected to the second tank 140 through the pipe 158. On the way of the pipe 158, the open/close valve 146 is provided. The outlet side of the second pump 142 is connected to the right upper port 88R of the processing tank 30 through the second control valve 144 and the pipe 160, and connected to the left lower port 90L of the processing tank 30 through the second valve 144 and the pipe 162.

On the way of the pipe 160, the open/close valve 148 is provided, and on the way of the pipe 162, the open/close valves 150, 152 are provided. The pipe 164 connects a node $N_4$ provided on the pipe 158 between the open/close valve 146 and the inlet side of the pump 142 and a node $N_5$ provided on the pipe 160 between the open/close valve 148 and the right upper port 88R. On the way of the pipe 164, the open/close valve 154 is provided. In addition, the pipe 166 connects the node $N_4$ and a node $N_6$ provided on the pipe 162 between the open/close valves 150, 152. On the way of the pipe 166, the open/close valve 156 is provided. A thermostat 168 is attached to the second tank 140 so as to control the temperature of the dye solution to a temperature suitable for the dye adsorption processing, for example, to 40° C. to 60° C.

Respective units (pumps, control valves, open/close valves) in the dye solution supply units 80, 82 and the flow control units 84, 86 are operated under the control of the controller 170. The controller 170 includes a microcomputer and an interface and controls the operation of each of the units in the dye adsorption unit 20, including the above-described moving system (FIGS. 3 and 4) and the operating sequence of the entire apparatus.

The processing tank 30 is provided with a pressure gage 172. The pressure gage 172 measures pressure at a predetermined position within the processing tank 30 (e.g., at a position adjacent to the top opening). The controller 170 monitors or feedbacks the measured pressure value $K_P$ from the pressure gage 172 to control the operation of the flow control units 84, 86.

[Action of Dye Adsorption Unit/Substrate Carrying-in Operation]

Next, descriptions will be made as to the operations of carrying non-processed substrates G to be subject to the batch type dye adsorption processing into the processing tank 30 in the dye adsorption unit 20 with reference to FIGS. 9 to 12.

Figure 9A:
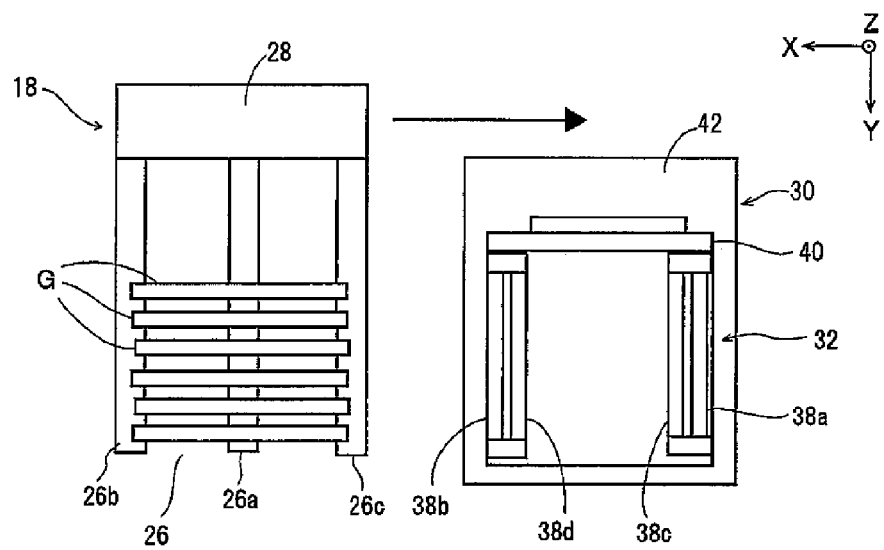
FIG. 9A is a plan view illustrating a step of a substrate carrying-in operation in the dye adsorption unit.
Figure 9B:
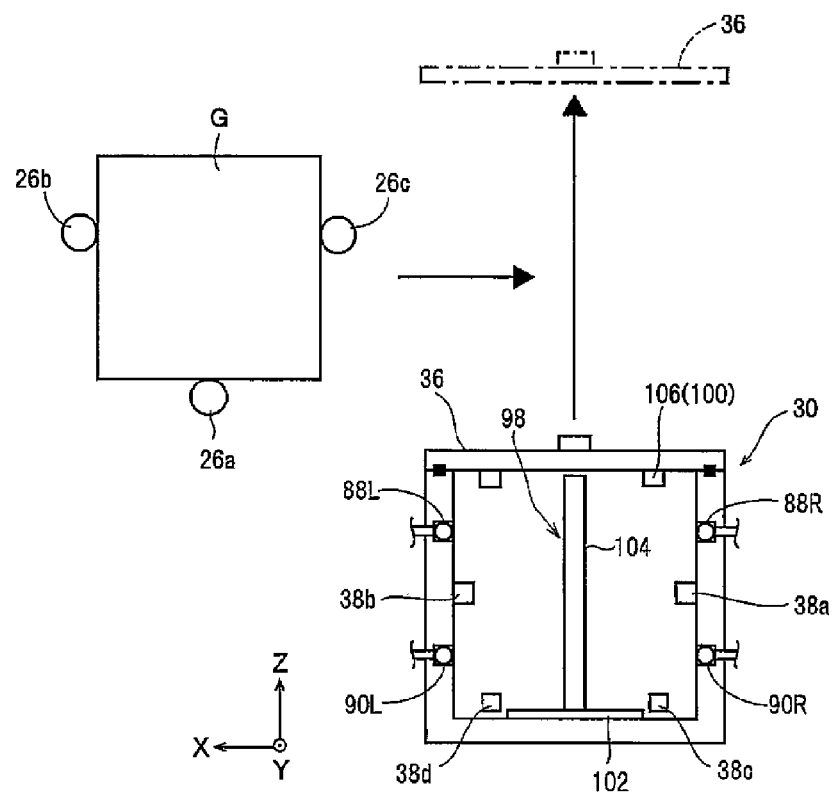
FIG. 9B is a side view illustrating a step of the substrate carrying-in operation in the dye adsorption unit.

The transport device 18 (FIGS. 1 and 2) is moved from the loader/unloader section 12 to the dye adsorption unit 20 along the rail 27 by the transport driving unit 28 in a state where the predetermined number (e.g., 50) non-processed substrates G are arranged horizontally in a row and grasped by the chuck unit 26 (FIG. 9A).

At this time, the boat 32 is positioned inside the processing tank 30 of the dye adsorption unit 20 in an empty state without being loaded with substrates G. The boat transport unit 34 separates and retracts the lift arm 44 from the boat 32. Before the transport device 18 comes, the top cover operating unit 72 lifts up and retracts the top cover 36 above the processing tank 30 and to a position where the top cover 36 does not interfere with the lift arm 44 (FIG. 9A). As such, the transport device 18 locates the chuck unit 26 in which the non-processed substrates G are grasped, just above the processing tank 30.

Figure 10:
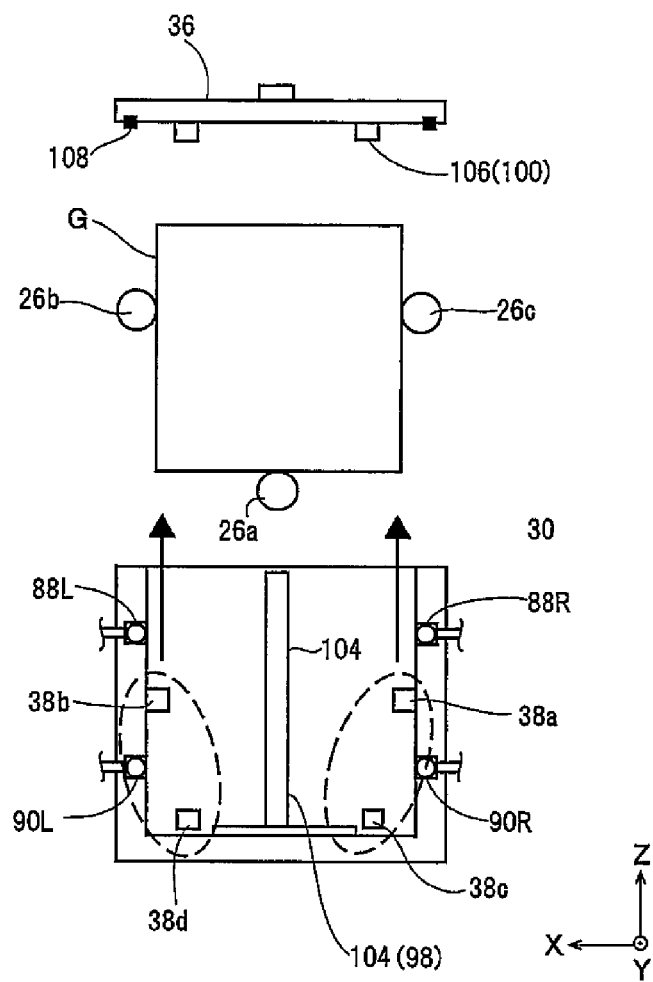
FIG. 10 is a side view illustrating a step of the substrate carrying-in operation in the dye adsorption unit.

Just after this, the boat transport unit 34 moves the lift arm 44 from the retracted position to the working position and lowers the lift arm 44 into the boat 32, and excites the electromagnet 46 so that the lift arm 44 is coupled to the boat 32. Subsequently, the boat transport unit 34 lifts up the lift arm 44 together with the boat 32 in the empty state (FIG. 10).

Figure 11A:
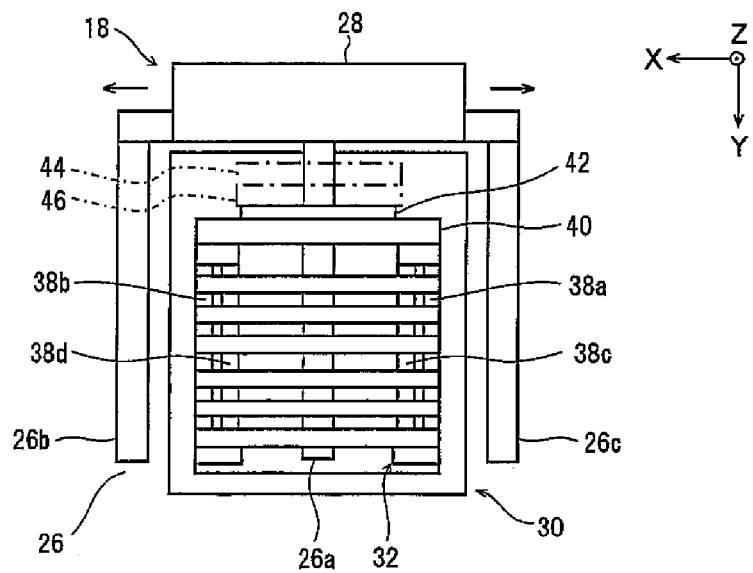
FIG. 11A is a plan view illustrating a step of the substrate carrying-in operation in the dye adsorption unit.
Figure 11B:
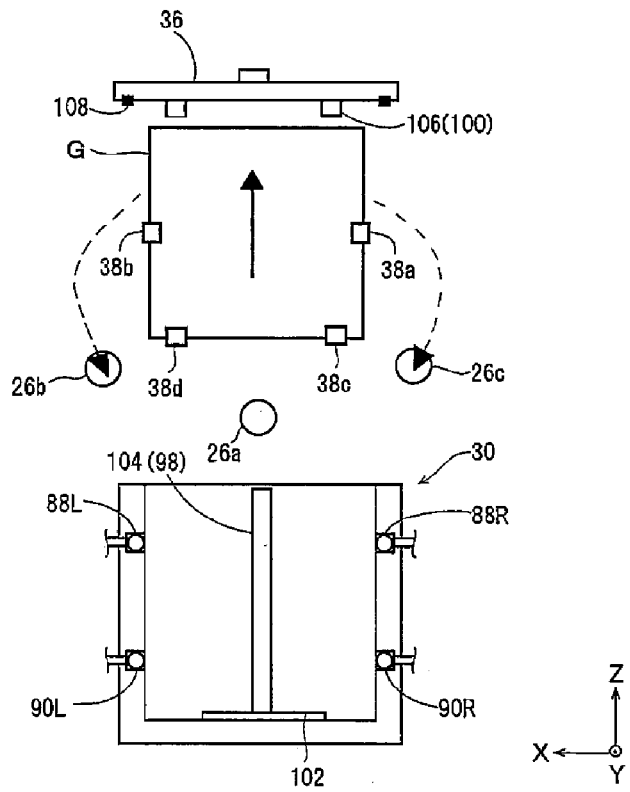
FIG. 11B is a side view illustrating a step of the substrate carrying-in operation in the dye adsorption unit.

By the upward movement of the boat 32, each of the holding grooves M formed in the holding units 38a, 38b, 38c, 38d of the boat 32 is engaged with the left, light or bottom side edge of corresponding one of the substrates G. In cooperation with the upward movement of the boat 32, the transport device 18 retracts the left and right moving chuck arms 26b, 26c to the outside. As such, the predetermined number of non-processed substrates G (e.g., 50 substrates) are transferred from the chuck unit 26 of the transport device 18 to the boat 32 just above the processing tank 30 while maintaining the state arranged horizontally in a row (FIGS. 11A and 11B).

Thereafter, the transport device 18 moves the chuck unit 26 horizontally (in the X direction) at a position at a height between the boat 32 and the processing tank 30, and starts for other units 22, 24 or the loader/unloader section 12 from the dye adsorption unit 20.

Figure 12A:
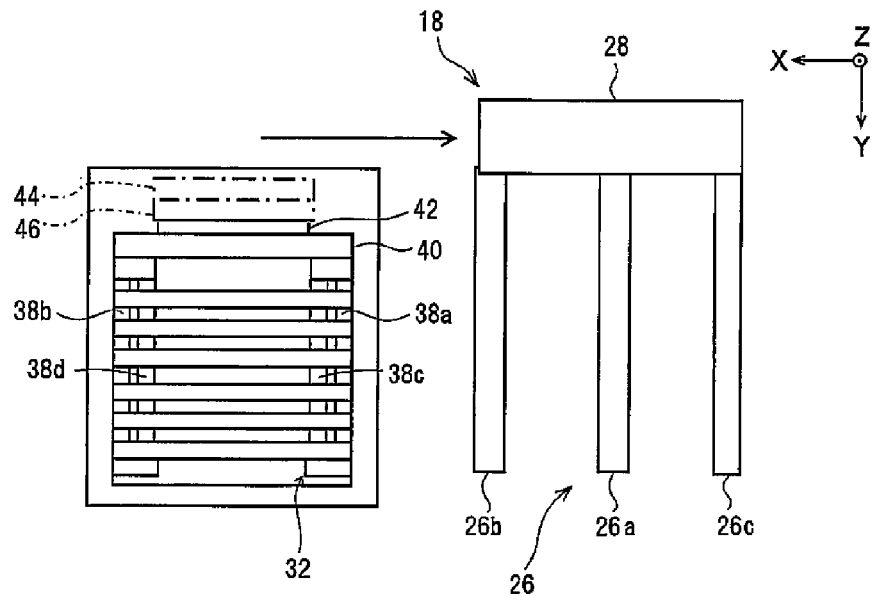
FIG. 12A is a plan view illustrating a step of the substrate carrying-in operation in the dye adsorption unit.
Figure 12B:
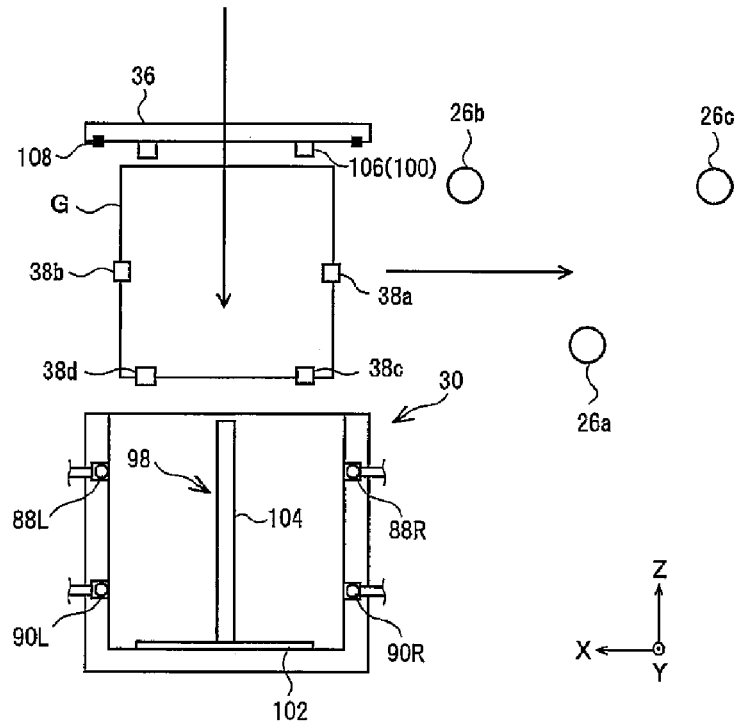
FIG. 12B is a side view illustrating a step of the substrate carrying-in operation in the dye adsorption unit.

After the transport device 18 is moved, the boat transport unit 34 lowers the lift arm 44 and the boat 32 in unison so that the lift arm 44, the boat 32 and the predetermined number of substrates G (e.g., 50 substrates) are carried into or accommodated in the processing tank 30 (FIGS. 12A and 12B). At this time, although the processing tank 30 may contain the dye solution, it may not matter if the tank 30 is empty without containing the dye solution at all.

Thus, when the predetermined number of non-processed substrates G are carried into the processing tank 30 in a state where they are arranged horizontally in a row on the boat 32, the boat transport unit 34 releases the excitation of the electromagnet 46, then separates the lift arm 44 from the boat 32 and retracts the lift arm 44 to the outside of the processing tank 30. Just after this, the top cover operating unit 72 lowers the top cover 36 so that the top opening of the processing tank 30 is closed by the top cover 36. In addition, during the dye adsorption processing, high pressure is applied to the top cover 36 from the inside of the processing tank 30 and thus, it is required to press the top cover 36 downward against the internal pressure. The top cover operating unit 72 may function to press the top cover 36 downward during the processing to maintain the fluid-tightness of the inside of the processing tank 30.

[Action of Dye Adsorption Unit/Operation of Controlling Supply and Flow of Dye Solution]

Next, descriptions will be made as to the operations of controlling the supply and flow of the dye solution in the dye adsorption unit 20 with reference to FIGS. 13A to 13F.

Firstly, in a case where the dye solution is not contained in the processing tank 30 or insufficiently contained in the processing tank 30 at the time when the boat 32, on which the predetermined number of non-processed substrates G are arranged and maintained horizontally in a row, is carried into the processing tank 30, the dye solution supply mode is selected first.

Figure 13A:
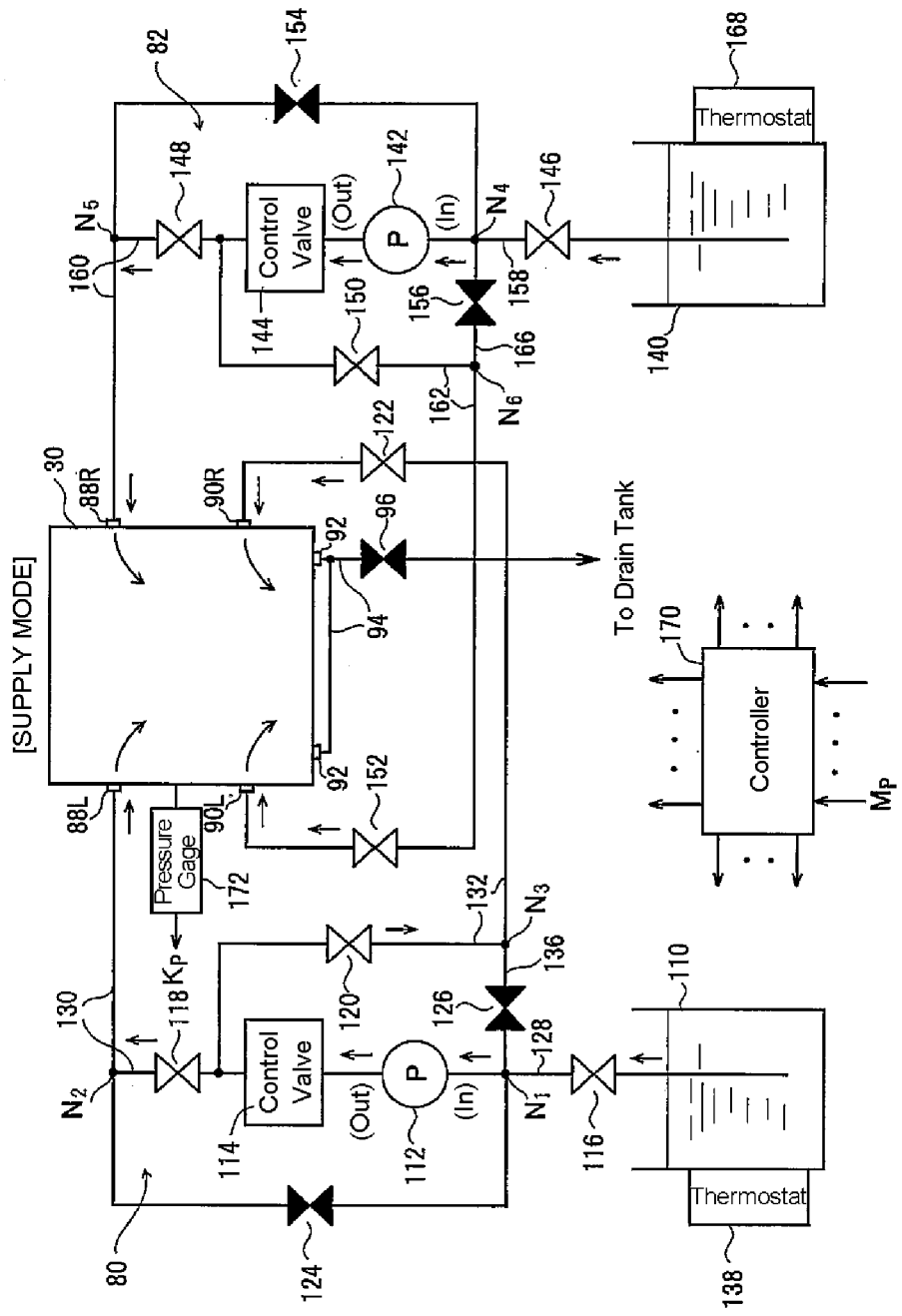
FIG. 13A is a view illustrating the status of each unit when a dye solution supply mode is selected in the dye adsorption unit.

Typically, in the dye solution supply mode, the first and second dye solution supply units 80, 82 are operated concurrently. More specifically, as illustrated in FIG. 13A, in the first dye solution supply unit 80, the first pump 112 is turned ON, the open/close valves 116, 118, 120, 122 are turned to the open (ON) state, and the other open/close valves 124, 126 are turned to close (OFF) state. Thus, the dye solution drawn up from the first tank 110 by the first pump 112 passes through the pipes 130, 132 and is supplied to the inside of the processing tank 30 from the left upper port 88L and the right lower port 90R.

In addition, in the second dye solution supply unit 82, the second pump 142 is turned ON, the open/close valves 146, 148, 150, 152 are turned to the open (ON) state, and the other open/close valves 154, 156 are turned to the close (OFF) state. Thus, the dye solution drawn up from the second tank 140 by the second pump 142 passes through the pipes 160, 162, and is supplied to the inside of the processing tank 30 from the right upper port 88R and left lower port 90L.

However, when the shortage of the dye solution in the processing tank 30 is not so much, only one side of the first and second dye solution supply units 80, 82, for example, only the first dye solution supply unit 80 may be operated. In such a case, although both of the left upper port 88L and the right lower port 90R may be used, it may not matter if only one side thereof is used. For example, when only the left upper port 88L is used as the supply port, only the open/close valve 116 of the pipe 128 and the open/close valve 118 of the pipe 132 may be turned to the open (ON) state and all of the other open/close valves may be maintained in the close (OFF) state.

In addition, in the dye solution supply mode, old dye solution may be substituted with new dye solution in the processing tank by opening the open/close valve 96 of the drain pipe 94.

Also, when the dye solution supply mode is operated, it is desirable to fill the inside of the processing tank 30 with dye solution by the dye solution supply mode. For this purpose, the non-processed substrates G may be carried into the processing tank 30, then the processing tank 30 may be fully filled with dye solution by the dye solution supply units 80, 82 while delaying the operation of the top cover operating unit 72, and then the top cover 36 may lowered to close the top opening of the processing tank 30.

When the filling or replenishing of the dye solution to the processing tank 30 by the dye solution supply units 80, 82 is completed through the above-described processes, the dye adsorption processing is started. Typically, the operation of the flow control units 83, 86 is started simultaneously with the starting of the dye adsorption processing.

In the operation of the flow control units 84, 86, various modes may be selected in connection with the flow of the processing solution within the processing tank 30. For example, as illustrated in FIGS. 13B and 13C, modes of stopping the second flow control unit 86 and operating only the first flow control unit 84 (first and second flow modes) may be selected.

Figure 13B:
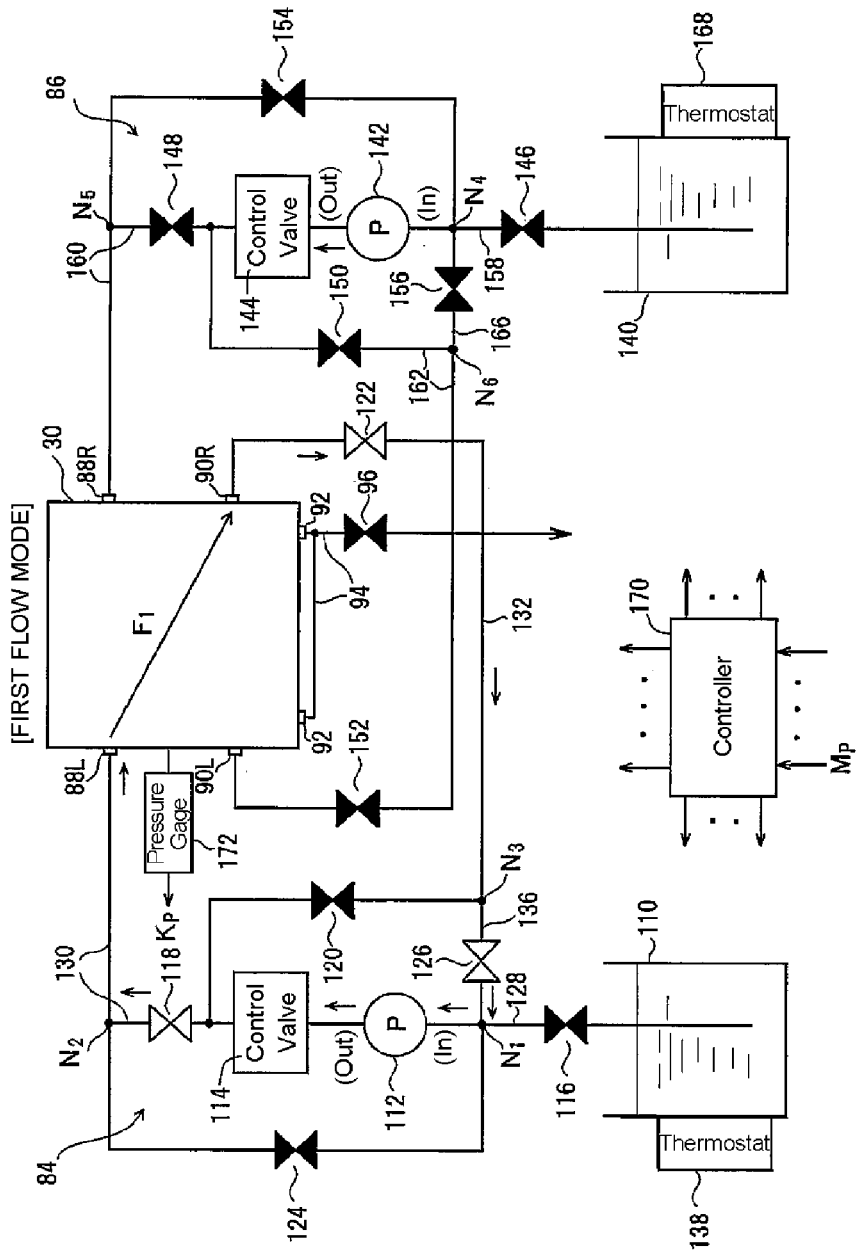
FIG. 13B is a view illustrating the status of each unit when a first flow mode is selected in the dye adsorption unit.
Figure 13C:
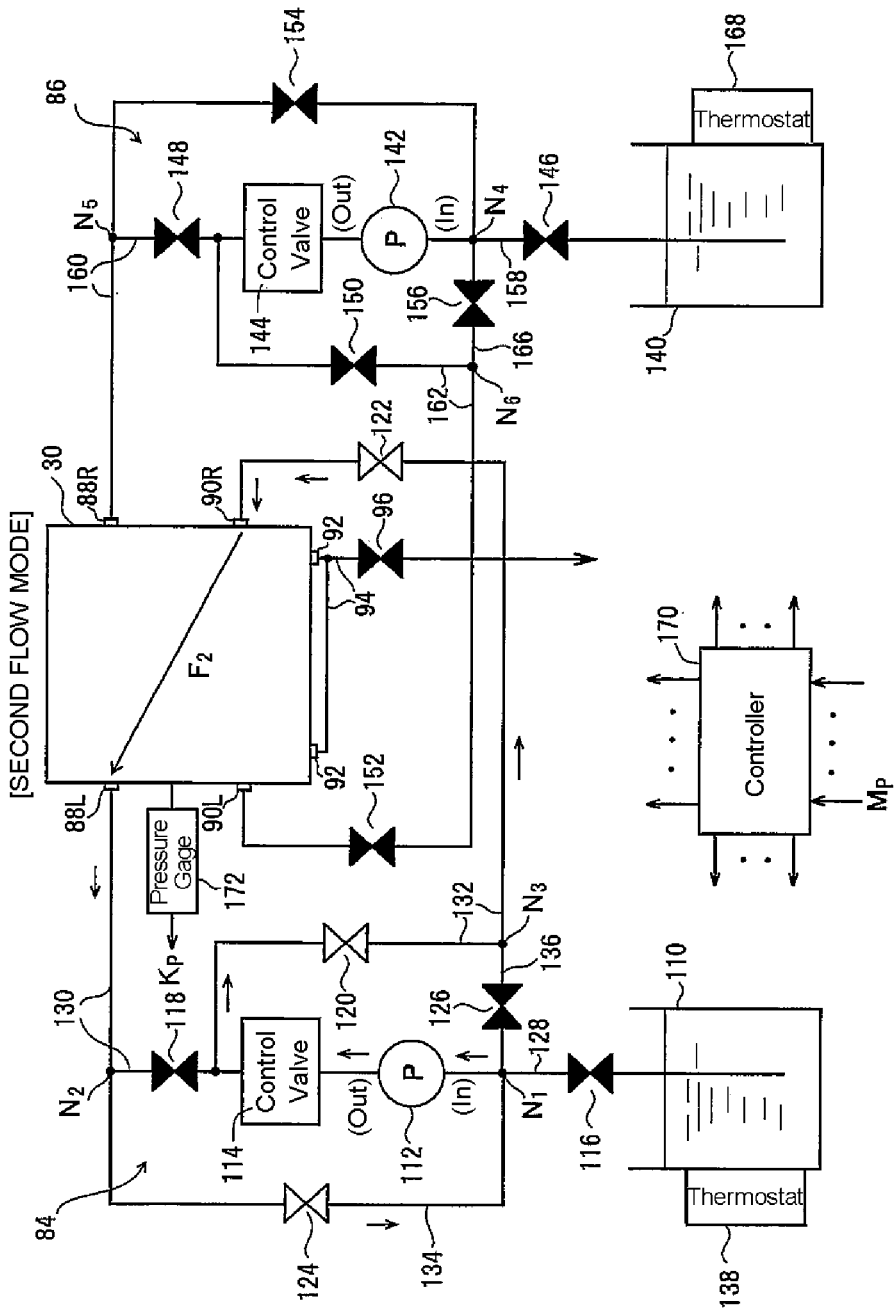
FIG. 13C is a view illustrating the status of each unit when a second flow mode is selected in the dye adsorption unit.

In the first flow mode of FIG. 13B, the first flow control unit 84 turns On the first pump 112, turns the open/close valves 118, 122, 126 to the open (ON) state, and turns the other open/close valves 116, 120, 124 to the close (OFF) state. Accordingly, the dye solution discharged from the outlet side of the first pump 112 passes through the first control valve 114 and the pipe 130 and is introduced into the processing tank 30 from the left upper port 88L. In addition, the dye solution discharged to the outside of the processing tank 30 from the right lower port 90R returns to the inlet side of the first pump 112 through the pipes 132, 136, 128. Meanwhile, the second flow control unit 86 maintains all of the second pump 142 and the open/close valves 146, 148, 150, 152, 154, 156 in the OFF state.

When the first flow mode is selected in this manner, a flow of the dye solution is formed in the processing tank 30 from the left upper port 88L to the right lower port 90R. That is, the dye solution discharged from each discharge opening of the left upper port 88L arrives at each suction opening of the right lower port 90R in the opposite side through each of the flow passing spaces RS spreading in front of the dye solution. At the right upper port 88R and the left lower port 90L, the dye solution does not go in and out.

Since the top opening of the processing tank 30 is closed by the top cover 36, the pressure within the processing tank 30 is considerably high as compared to the pressure when the top opening is opened to the atmosphere, and in each of the flow passing spaces RS, the flow of dye solution is formed under this high pressure. Here, all the substrates G on the boat 32 accommodated in the processing tank 30 are arranged such that the treated surfaces $G_s$ face the flow passing spaces RS, thereby being exposed to the flow of the dye solution of high pressure. Thus, the dye solution may penetrate into the treated surface $G_s$ of each of the substrates G rapidly and smoothly, aggregation or cohesion of dye is hardly caused on a surface layer portion of the porous semiconductor layer 204 of the treated surface $G_S$, and thus, the dye may be efficiently and rapidly adsorbed into the porous semiconductor layer 204.

In the second flow mode of FIG. 13C, the first flow control unit 84 turns ON the first pump 112, turns the open/close valves 120, 122, 124 to the open (ON) state, and turns the other open/close valves 116, 118, 126 to the close (OFF) state. Accordingly, the dye solution discharged from the outlet side of the first pump 112 passes through the first control valve 114 and the pipe 132 and is introduced into the processing tank 30 from the right lower port 90R. In addition, the dye solution discharged to the outside of the processing tank 30 from the right upper port 88L passes through the pipes 130, 134, 128 and returns to the inlet side of the first pump 112. Meanwhile, the second flow control unit 86 maintains all of the second pump 142 and the open/close valves 146, 148, 150, 152, 154, 156 in the OFF state.

Like this, according to the second flow mode, in the processing tank 30, the flow of the dye solution is formed from the right lower port 90R to the left upper port 88L. That is, the dye solution discharged from each discharge opening of the right lower port arrives at each suction opening of the left upper port 88L in the opposite side through each of the flow passing space RS spreading in front of the dye solution. Also, at the right upper port 88R and left lower port 90L, the dye solution does not go in and out.

Also in this case, all the substrates G on the boat 32 accommodated in the processing tank 30 are arranged such that each of the treated surfaces $G_S$ face the flow passing spaces RS, thereby being exposed to the flow of the dye solution of high pressure. Accordingly, the dye solution may penetrate into the treated surface $G_S$ of each of the substrates G rapidly and smoothly, aggregation or cohesion of the dye is hardly caused on the surface layer portion of the porous semiconductor layer 204 of the treated surface $G_S$, and thus, the dye may be adsorbed into the porous semiconductor layer 204 efficiently and rapidly.

Figure 13D:
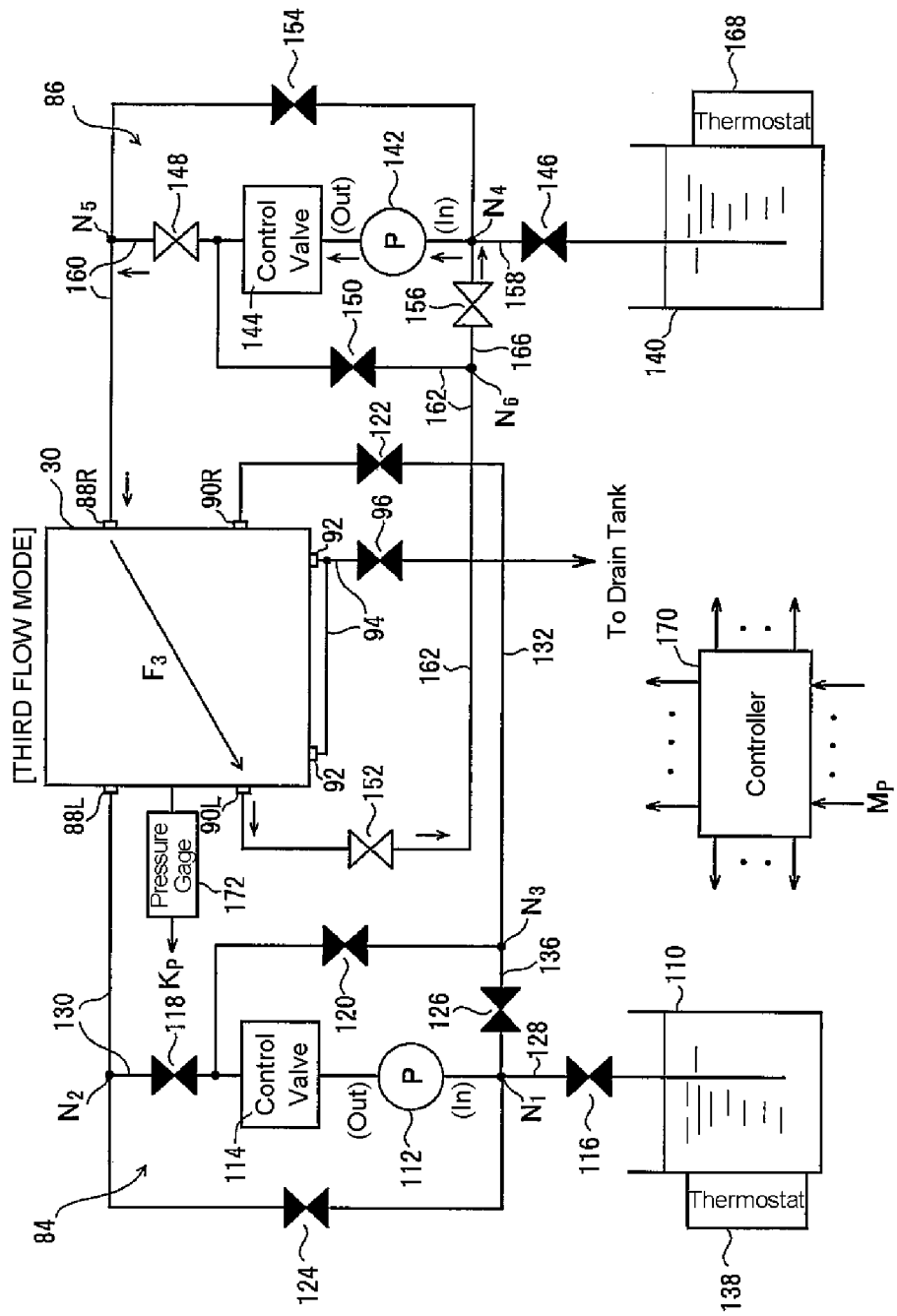
FIG. 13D is a view illustrating the status of each unit when a third flow mode is selected in the dye adsorption unit.
Figure 13E:
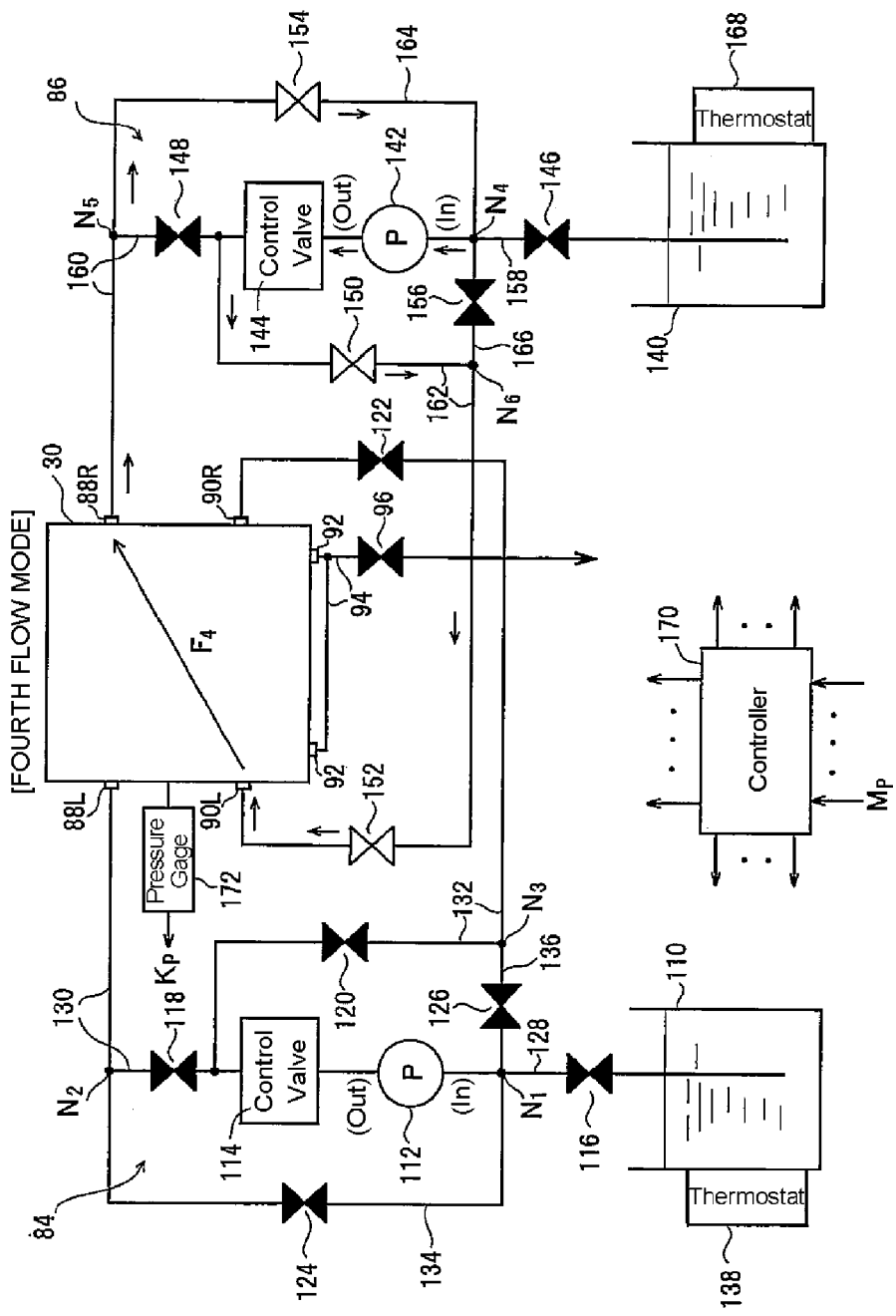
FIG. 13E is a view illustrating the status of each unit when a fourth flow mode is selected in the dye adsorption unit.

Also, in the present exemplary embodiment, as illustrated in FIG. 13D or FIG. 13E, the modes of stopping the first flow control unit 84 and operating only the second flow control unit 86 (third and fourth flow modes) may be selected.

In the third flow mode of FIG. 13D, the second flow control unit 86 turns ON the second pump 142, turns open/close valves 148, 152, 156 to the open (ON) state, and turns other open/close valves 146, 150, 154 to the close (OFF) state. Thus, the dye solution discharged from the outlet side of the second pump 142 passes through the second control valve 144 and the pipe 160 and is introduced into the processing tank 30 from the right upper port 88R. And, the dye solution discharged to the outside of the processing tank 30 from the left lower port 90L returns to the inlet side of the second pump 142 through the pipes 162, 166, 158. Meanwhile, the first flow control unit 84 maintains all of the first pump 112 and the open/close valves 116, 118, 120, 122, 124, 126 in the OFF state.

When the third flow mode is selected in this manner, a flow of the dye solution is formed from the right upper port 88R to the left lower port 90L in the processing tank 30. That is, the dye solution discharged from each discharge opening of the right upper port 88R arrives at each suction opening of the left lower port 90L in the opposite side through each of the flow passing spaces RS spreading in front of the dye solution. At the left upper port 88L and the right lower port 90R, the dye solution does not go in and out.

Also in this case, all the substrates G on the boat 32 accommodated in the processing tank 30 are arranged such that the treated surface $G_S$ face the flow passing spaces RS, thereby being exposed to the flow of the dye solution of high pressure. Thus, the dye solution penetrates into the treated surface $G_S$ of each substrate rapidly and smoothly and thus, the dye may be adsorbed from the surface layer into the inside of the porous semiconductor layer 204 of the treated surface efficiently and rapidly.

In the fourth flow mode of FIG. 13E, the second flow control unit 86 turns ON the second pump 142, turns the open/close valves 150, 152, 154 to the open (ON) state, and turns the other open/close valves 146, 148, 156 to the close (OFF) state. Thus, the dye solution discharged to the outlet side of the second pump 142 passes through the second control valve 144 and the pipe 162 and is introduced into the processing tank 30 from the left lower port 90L. In addition, the dye solution discharged to the outside of the processing tank 30 from the right upper port 88R passes through the pipes 160, 164, 158 and returns to the inlet side of the second pump 142. Meanwhile, the first flow control unit 84 maintains all of the first pump 112 and the open/close valves 116, 118, 120, 124, 126 in the OFF state.

Like this, according to the fourth flow mode, a flow of the dye solution is formed from the left lower port 90L to the right upper port 88R in the processing tank 30. That is, the dye solution discharged from each discharge opening of the left lower port 90L arrives at each suction opening of the right upper port 88R through each of the flow passing spaces RS spreading in front of the dye solution. Also, at the left upper port 88L and the right lower port 90R, the dye solution does not go in and out.

Also in this case, all the substrates G on the boat 32 accommodated in the processing tank 30 are arranged such that the treated surface $G_S$ face the flow passing spaces RS, thereby being exposed to the flow of the dye solution of high pressure. Thus, the dye solution penetrates into the treated surface $G_S$ of each substrate rapidly and smoothly, and thus, the dye may be adsorbed from the surface layer into the inside of the porous semiconductor layer 204 of the treated surface efficiently and rapidly.

Figure 13F:
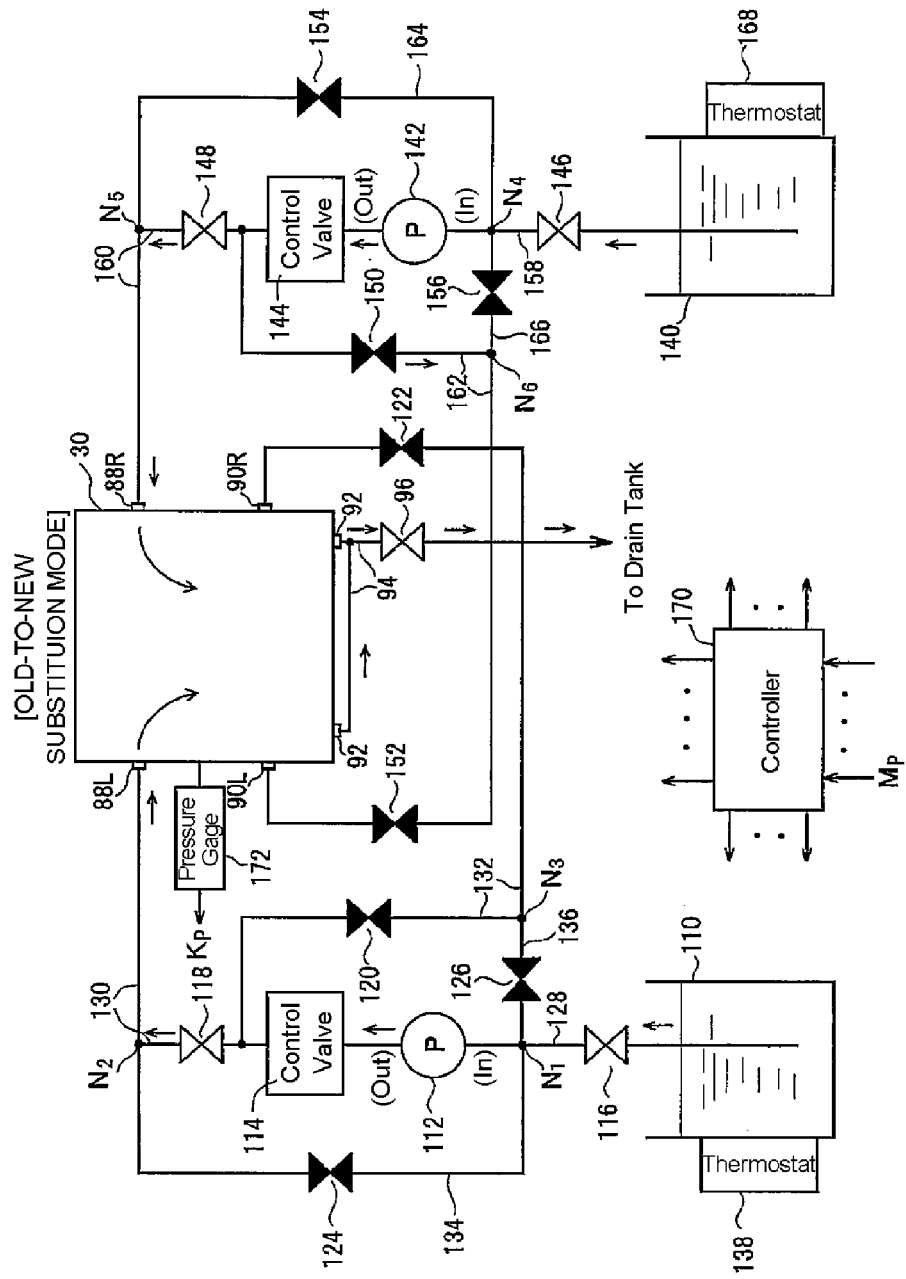
FIG. 13F is a view illustrating the status of each unit when a fifth mode is selected in the dye adsorption unit.

In the first to fourth flow modes, the dye solution is circulated between the inside and outside of the processing tank 30. Thus, as the dye adsorption processing proceeds, the dye in the dye solution gradually decreases and thus, the concentration of the dye solution gradually decreases. Accordingly, in order to maintain or recover the concentration of the dye solution in a set range, it is desirable to properly change the modes during the dye adsorption processing to a mode (fifth flow mode) in which, for example, as illustrated in FIG. 13F, the open/close valve 96 of the drain pipe 94 is turned to the open (ON) state to control the flow of the dye solution while substituting the old dye solution with new dye solution.

In the fifth flow mode, the first and second flow control units 84, 86 turn the first and second pumps 112, 142, respectively, and turn the open/close valves 116, 118, and the open/close valves 146, 148 to the open (ON) state, respectively, and turn the other open/close valves 120, 122, 124, 126 and the open/close valves 50, 152, 154, 156 to the close (OFF) state, respectively. Thus, the dye solution (new solution) discharged from the outlet sides of the first and second pumps 112, 142 passes through the first and second control valves 114, 144 and the pipes 130, 160 and is introduced into the processing tank 30 from the left and right upper ports 88L, 88R. Meanwhile, the dye solution (old solution) discharged to the outside of the processing tank 30 from the drain port 92 is sent to the drain tank through the drain pipe 94 or recovered. As such, the substitution of old dye solution with new dye solution is conducted from the upper side toward the lower side (bottom) in the processing tank 30.

At this time, within processing tank 30, the dye solution coming out from each discharge opening of the left and right upper ports 88L, 88R arrives at a drain port in the bottom side through each of the flow passing spaces RS spreading in front of it. Also in such a case, all the substrates G on the boat 32 accommodated in the processing tank 30 lie such that the treated surfaces $G_s$ thereof face the flow passing spaces RS, respectively, thereby being exposed to the flow of the dye solution of high pressure. Thus, the dye solution penetrates into the treated surface $G_S$ of each substrate G rapidly and smoothly, and thus, the dye may be adsorbed from the surface layer into the inside of the porous semiconductor layer 204 of the treated surface efficiently and rapidly. In addition, as an aspect of the fifth flow mode, only one side of the first and second flow control units 84, 86 may be operated to stop the other side.

In the present exemplary embodiment, a sequence of a dye adsorption processing may be programmed by selectively combining various types of flow modes as described above. As described above, during the processing, the flow direction of the dye solution within the processing tank 30 may be variously changed and thus, the penetration of the dye solution in relation to the treated surface $G_S$ of each of the substrates G may be further facilitated and the dye adsorption efficiency or rate may be further enhanced.

Also, in the present exemplary embodiment, the pressure or flow late of the dye solution within the processing tank 30 may be arbitrarily varied using the pressure control function or flow rate control function of the control valves 114, 144 provided in the first and second flow control units 84, 86. As described above, since the dye adsorption processing of this type causes the dye solution to penetrate into the porous semiconductor layer of the treated surface of a substrate so that the dye is adsorbed from the surface layer of the semiconductor layer into the porous semiconductor layer, the dye adsorption efficiency or rate tends to decrease as the processing time passes. Thus, a method of linearly increasing the pressure or flow rate within the processing tank 30 as the processing time passes or a method of increasing the pressure or flow rate within the processing tank 30 step by step, during the processing time (more preferably, in the latter half of the processing time or just before the end of the processing time) may be properly employed.

As described above, in the dye adsorption unit 20 of the present exemplary embodiment, since the flow of the dye solution is formed within the processing tank 30 under high pressure, and the treated surfaces $G_S$ of the substrates G are exposed in the flow of the dye solution, aggregation or cohesion of dye is hardly caused on a surface layer portion of the porous semiconductor layer 204 of the treated surface $G_S$ of each of the substrates, the dye efficiently penetrates into the porous semiconductor layer 204, and thus, the dye adsorption into the porous semiconductor layer 204 may proceed at high speed. By using the method of the present exemplary embodiment, the time required for a dye adsorption processing in a dye sensitization solar cell fabrication process may be significantly reduced. For example, one batch processing may be completed within 10 minutes.

In addition, in the dye adsorption unit 20 of the present exemplary embodiment, a plurality of substrates G that are subject to the batch type dye adsorption processing within the processing tank 30 are supported at the rear sides and top side edges thereof by the support members 98, 100 which are provided in the processing tank 30 and on the top cover 36, respectively, the substrates are rarely flexed or inclined in the flow of the dye solution, especially in relation to the pressure received from a flow passing space RS. Thus, the damage or deformation of the substrates G may be suppressed. In addition, when the protrusions 104, 106 of the support members 98, 100 come into contact with the rear surfaces of the substrates G, the contact may be any of plane contact, line contact and point contact. The treated surface $G_S$ of the substrates may not affected by any of the contact types.

The protrusions 104, 106 of the support members 98, 100 may maintain the posture of the substrates G stably within the processing tank 30 in this manner. In addition, the protrusions 104, 106 may suppress the flow of the dye solution along the rear surfaces of the substrates as described above and as the reflective effects thereof, the protrusions 104, 106 of the support members 98, 100 may serve to facilitate the flow of the dye solution along the front surfaces (treated surfaces $G_S$) of the substrates G and moreover, enhance the dye adsorption efficiency.

In addition, when the batch type dye adsorption processing is ended as the predetermined processing time has lapsed, the operation of carrying treatment completed substrates G out of the processing tank 30 in a state where all the dye solution supply units 80, 82 and the flow control units 84, 86 stop the operations thereof. Although not illustrated, the carrying-out operation of treatment completed substrates are performed in the order reverse to that of the above-described carrying-in operation of non-processed substrates, i.e. in the order like turning time back.

That is, first, the top cover operating unit 72 is operated to lift up the top cover 36, thereby opening the top opening of the processing tank 30 to the atmosphere. Then, the boat transport unit 34 moves the lift arm 44 from the retracted position to the working position and lowers the lift arm 44 into the boat 32, and excites the electromagnet 46 to couple the lift arm 44 to the boat 32. In addition, the boat transport unit 34 lifts up the boat 32 loaded with the treatment completed substrates G and the boat 32 together with the lift arm 44. Just after this, the transport device 18 (FIGS. 1 and 2) moves to the dye adsorption unit 26 in a state where the chuck unit 26 is empty without grasping substrates and the left and right movable chuck arms 26b, 26c are spread to the outside, and locates the chuck unit 26 just above the processing tank 30. In addition, simultaneously when the boat transport unit 34 lowers the boat 32, transport device 18 moves the left and right chuck arms 26b, 26c inwardly to approach each other at predetermined timing so that the left and right side edges of the substrates G are held in the holding recesses of the opposite movable chuck arms 26b, 26c, respectively. By the downward movement of the boat 32 and the chucking operation of the chuck unit 26, the predetermined number of treatment completed substrates G are transferred from the boat 32 to the chuck unit 26 of the transport device 18 in the state where they are arranged horizontally in a row.

Upon receiving the predetermined number of treatment completed substrates G as described above, the transport device 18 moves from the dye adsorption unit 20 to the neighboring rinse unit 22 where the treatment completed substrates G are subject to a rinse processing. The rinse unit 22 has a well-known configuration and projects a rinse solution violently evenly over the treatment completed substrates G by, for example, a rinse nozzle so that the dye solution adhered to the front and rear surfaces of each of the substrates G is substituted with the rinse solution.

The predetermined number of treatment completed substrates G, to which the rinse processing has been completed in the rinse unit 22, are carried into the neighboring dry unit 24 by the transport device 18. The dry unit 24 also has a known configuration and blows dry air or nitrogen gas violently to each of the substrates G by, for example, an air nozzle so that the rinse solution adhered to the front and rear surfaces of each of the substrates G is removed.

The predetermined number of treatment completed substrates G, to which the dry processing has been completed in the dry unit 22, is transported to the neighboring loader/unloader unit 12 by the transport device 18. In the present exemplary embodiment, in the loader/unloader unit 12, the predetermined number of treatment completed substrates (e.g., 50 substrates) G are divided into two sets (25 substrates per each set) and transferred from the chuck unit 26 of the transport device 18 to two cassettes C. In that event, the substrates may be accommodated in the cassettes C by arranging all the neighboring substrates G, G, of which the rear sides have faced each other, to face the same direction. The treatment completed substrates G transferred to the cassettes C are transferred to the cassette carrying-in/carrying-out section 10 by the conveyance arm 16 and taken out from the dye adsorption processing system (FIG. 1) by a transport vehicle or a transport robot.

[Other Exemplary Embodiment or Modified Embodiment]

Figure 14A:
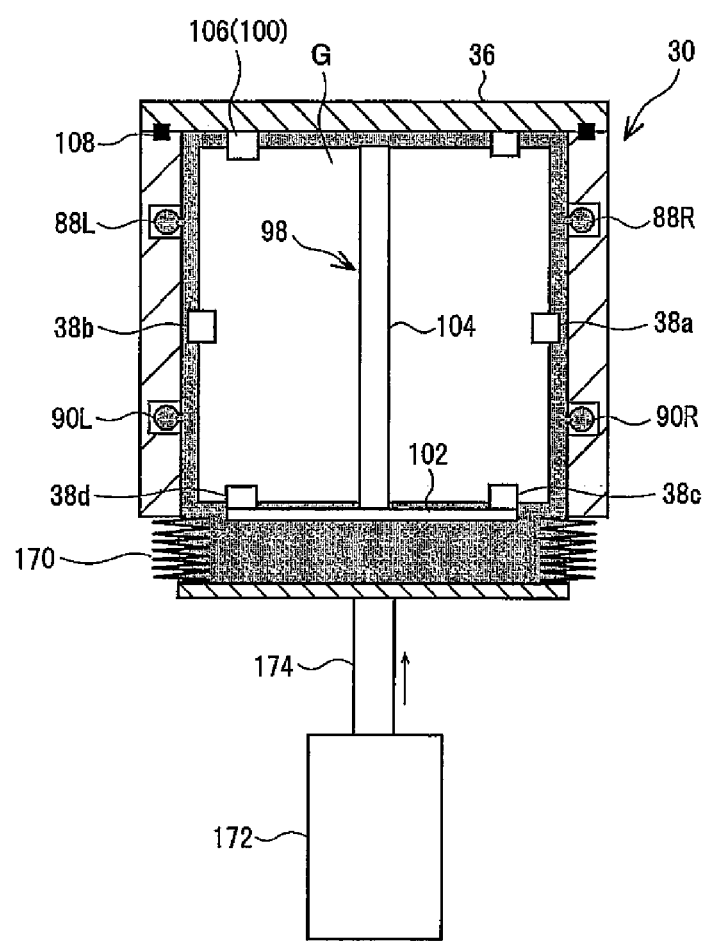
FIG. 14 is a view illustrating a modified embodiment for varying the pressure within the pressing tank in the dye adsorption unit.
Figure 14B:
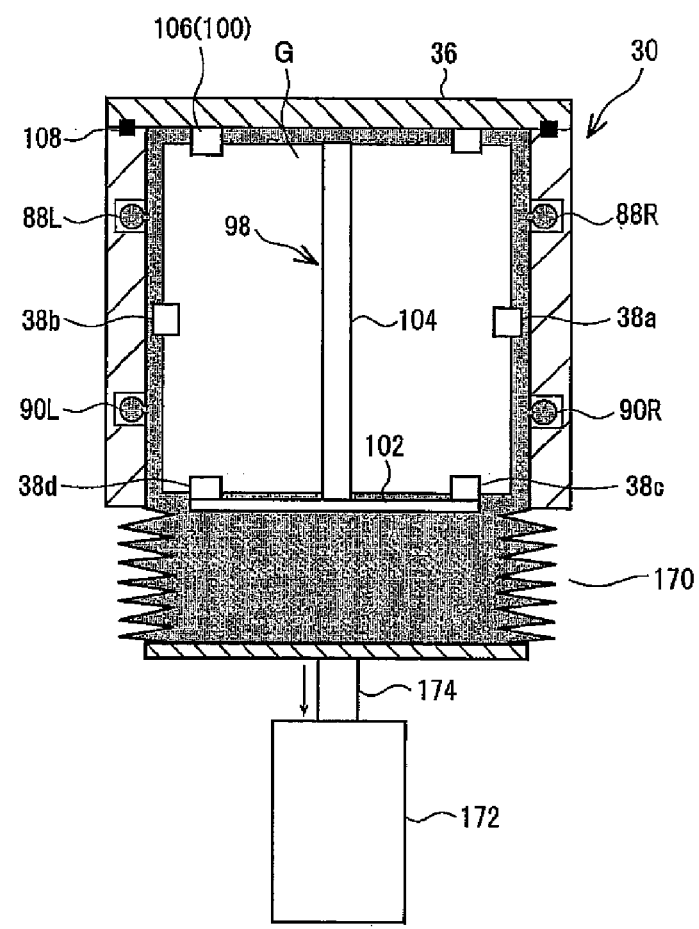

In the above-described exemplary embodiments, the pressure within the processing tank 30 may be varied or adjusted using the pressure control function of the control valves 114, 144 provided in the first and second flow control units 84, 86. However, in order to obtain a larger amplitude or variation range for the pressure within processing tank 30, for example, a configuration may be properly employed in which a bellows 175 is attached to the bottom of the processing tank 30 to be expanded and contracted by a rectilinear driving unit 176 such as, for example, a cylinder, as illustrated in FIG. 14. In such a case, when the driving shaft is moved forward or upward to contract the bellows 175 as illustrated in FIG. 14A, the volume of the processing tank 30 decreases and the pressure increases. On the contrary to this, when the driving shat 174 is moved rearward or downward as illustrated in FIG. 14B, the volume of the processing tank 30 increases and the pressure decreases.

Figure 15A:
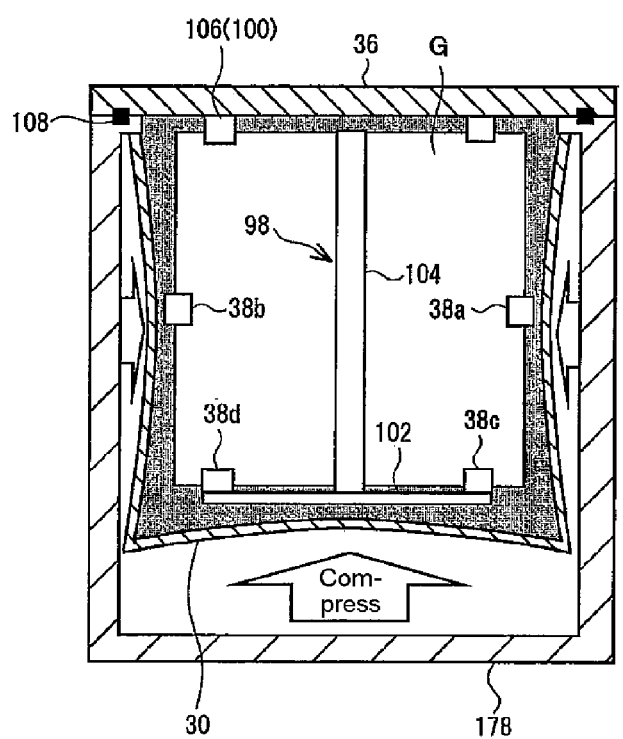
FIG. 15 is a view illustrating another modified embodiment for varying the pressure within the pressing tank in the dye adsorption unit.
Figure 15B:
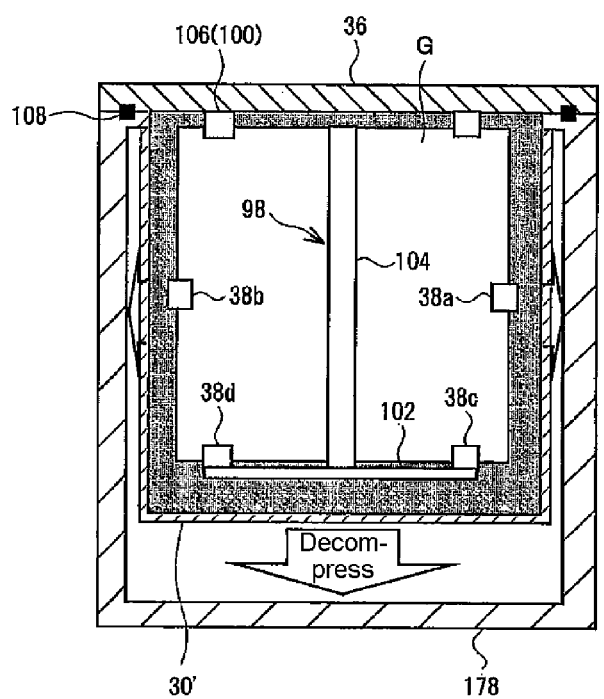

As a separate exemplary embodiment, as illustrated in FIG. 15, a NOWPACK (brand name) type configuration may also be employed in which a processing tank 30' made up of a flexible material is accommodated in an external tank 178 made up of a rigid material with a sealable gap 180 being provided between them. In such a case, the pressure within the processing tank 30' may be varied or adjusted by making the fluid within the gap 180 go in and out of the gap 180 to contract or expand the pressing tank 30'.

In the above-described exemplary embodiments, both the processing tank 30 and the top cover 36 are provided with the support members 98 and 100 that support the substrates G at the rear sides thereof. However, only one of the processing tank 30 and the top cover 36 may be provided with the support member 98 (100).

Figure 16A:
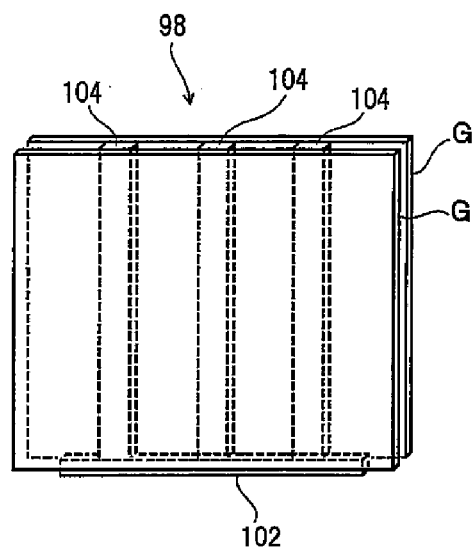
FIGS. 16A to 16C are views illustrating exemplary embodiments of the substrate support unit of the dye adsorption unit.
Figure 16B:
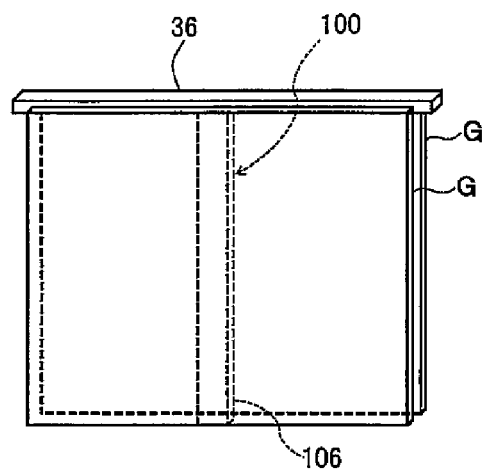
Figure 16C:
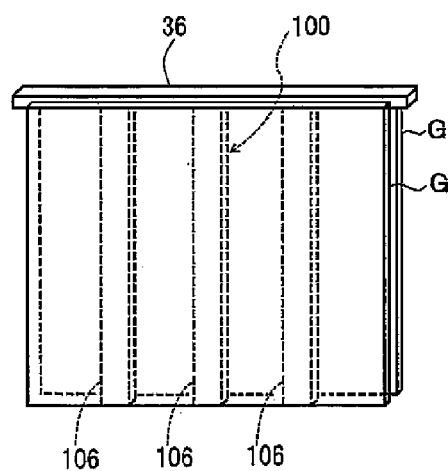

In addition, for example, as illustrated in FIG. 16A, it is also possible to provide a plurality of body protrusions 104, for example, three body protrusions 104 may be provided on the support member 98 which is provided in the processing tank 30. Alternatively, for example, as illustrated in FIGS. 16B and 16C, the cover protrusions 106 of the support body 100 provided on the top cover 36 may extend to a position in the vicinity of lower ends of the substrates G.

Figure 17A:
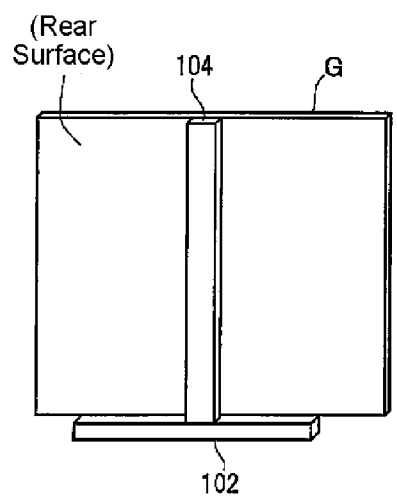
FIG. 17 is a view illustrating an exemplary embodiment of the substrate support unit of the dye adsorption unit.
Figure 17B:
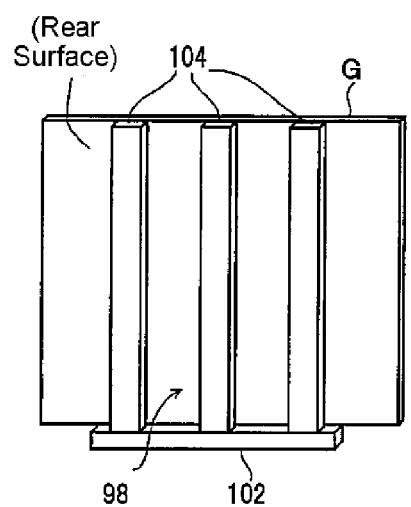
Figure 17C:
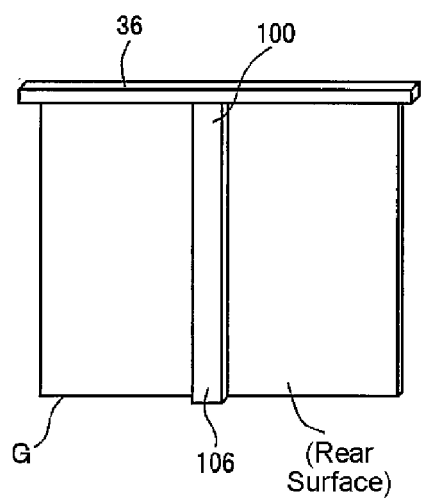
Figure 17D:
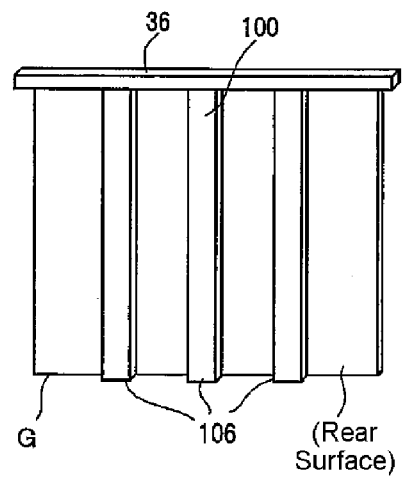
Figure 18A:
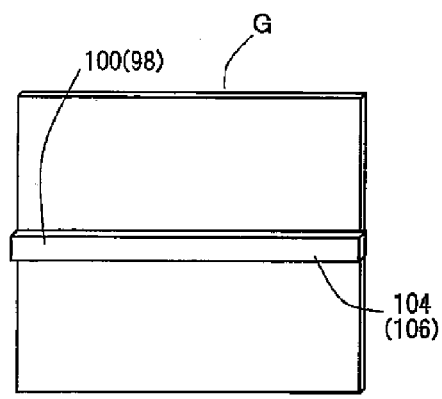
FIG. 18 is a view illustrating an exemplary embodiment of the substrate support unit of the dye adsorption unit.
Figure 18B:
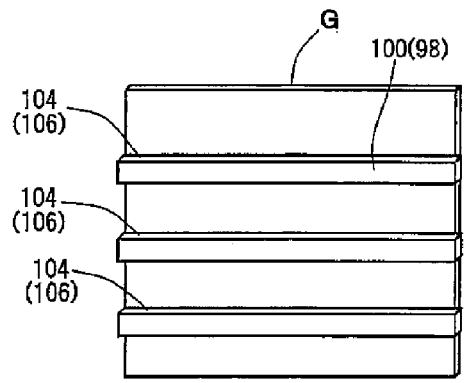
Figure 18C:
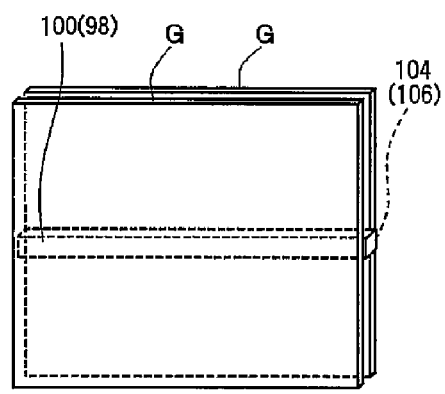
Figure 18D:
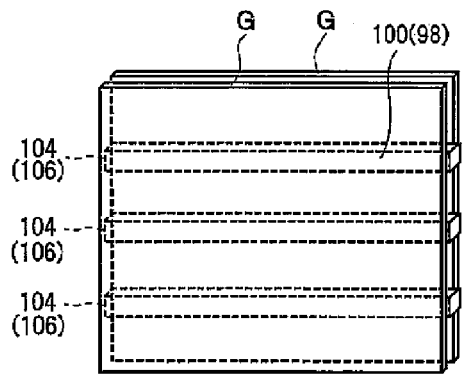
Figure 19A:
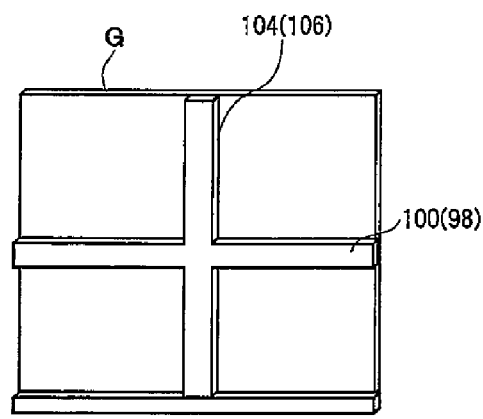
FIG. 19 is a view illustrating an exemplary embodiment of the substrate support unit of the dye adsorption unit.
Figure 19B:
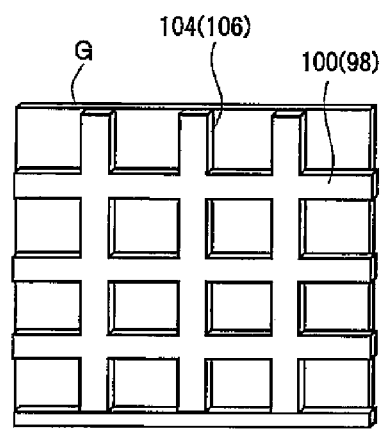
Figure 19C:
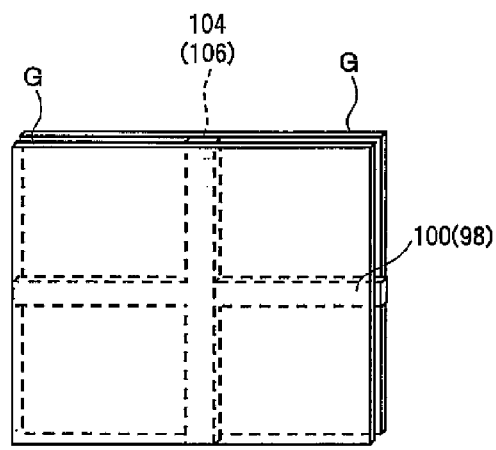
Figure 19D:
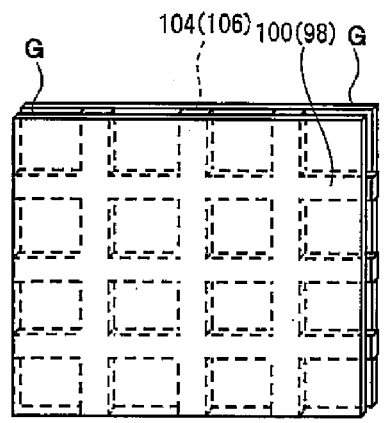

In the above-described exemplary embodiments, the predetermined number of substrates G held on the boat 32 within the processing tank 30 are arranged in such a manner that a pair of adjacent substrates G, G are arranged so that the treated surfaces $G_S$, $G_S$ thereof are directed in the opposite directions, i.e., the rear surfaces of thereof face each other. In addition, the body protrusion 104 and the cover protrusion 106 are disposed (inserted) in the space TS of the substrates G, G of the pair. However, on the boat 32, all or some of the substrates may be arranged horizontally in a row such that the treated surfaces are directed to the same direction. Also in such a case, the configuration in which the body protrusion 104 of the substrate support unit 98 is disposed (inserted) at the rear side of each of the substrates G as illustrated in FIGS. 17A and 17B and/or the configuration in which the cover protrusion 106 of the substrate support unit 100 is disposed (inserted) at the rear side of each of the substrates G as illustrated in FIGS. 17C and 17D may be employed.

However, in the configuration where all or some of the substrates G are arranged horizontally in a row on the boat 32 such that the treated surfaces thereof are directed to the same direction, when the body protrusion 104 of the substrate support unit 98 and/or the cover protrusion 106 of the substrate support unit 100 are provided, the entire space of the processing tank 30 may increase in securing a sufficient flow passing space at the treated surface side of each of the substrates G.

The protrusions 104, 106 of the substrate support units 98, 100 are not limited to a construction in which they extend only in the vertical direction. For example, a construction in which the protrusions extend in the horizontal direction as illustrated in FIG. 18, or a construction in which the protrusions extend in a grid form as illustrated in FIG. 19 may also be employed.

In the above-described exemplary embodiments, the protrusions 104, 106 of the substrate support units 98, 100 not only function to retain the substrates G at the rear side but also function to suppress the flow of dye solution along the rear surfaces of the substrates G. However, the protrusions 104, 106 may be configured such that they are not contacted with the rear surfaces of the substrates G, that is, they only have the baffle function of suppressing the flow of the dye solution along the rear surfaces of the substrates G without having the function of supporting the substrates.

The shapes, configurations and number of the ports provided in the processing tank 30 may be variously modified. For example, in the above-described exemplary embodiments, the processing tank 30 is provided with the left upper port 88L, the right upper port 88R, the left lower port 90L, and the right lower port 90R, and the dye solution supply units 80, 82 and the flow control units 84, 86 share some or all of these ports 88L, 88R, 90L, 90R. However, the dye solution supply units 80, 82 and/or the flow control units 84, 86 may use individual ports, respectively.

In the above-described exemplary embodiment, the flow control units 84, 86 are provided separately from the dye solution supply units 80, 82 in order to switch the flow direction of the dye solution within the processing tank 30. However, the dye solution supply units 80, 82 may be configured to include the function of the flow control units 84, 86 or to switch the flow direction of the dye solution within the processing tank 30 during the processing.

The surrounding configuration of the boat 32 may be variously modified. For example, in order to detachably couple the lift arm 44 of the boat transport unit 34 to the boat 32 by electromagnetic force, the above-described exemplary embodiments employ a configuration in which the permanent magnet 42 is attached to the boat 32 and the electromagnet 46 is attached to the lift arm 44 of the boat transport unit 34. However, in place of the electromagnetic force, it is possible to employ a configuration in which the lift arm 44 is coupled to the boat 32 by a mechanical attaching/detaching method.

Alternatively, although not illustrated, it is also possible to employ a configuration in which the lift arm 44 is integrally coupled to the boat 32 and a top cover fastening unit (not illustrated) is provided to detachably fix the top cover 36 to the lift arm 44. In such a case, while the boat 32 is being accommodated in the processing tank together with a predetermined number of substrates G (e.g., 50 substrates) for the dye adsorption processing, the top opening of the processing tank 30 is closed by the top cover 36 in a state where the top cover 36 is fixed to the lift arm by the top cover fastening unit. In addition, when the plurality of substrates G are loaded on or unloaded from the boat 32 in the outside of the processing tank 30, the top cover fastening unit is released and then the top cover 36 is retracted on or separated from the lift arm 44.

In addition, the above-described exemplary embodiments use the boat 32. However, as another method, a plurality of substrates may be accommodated in a row within the processing tank 30 in such a manner that the treated surfaces of the substrates are parallel to each other. In addition, the substrates may be accommodated in the boat 32 in such manner that the treated surfaces thereof do not face horizontally. For example, the substrates may be accommodated in the boat such that the treated surfaces thereof face upward, downward or in any other direction.

In addition, the dye solution is supplied in a first direction parallel to the treated surfaces of the substrates. Then, it is switched to a second direction which is different from the first direction and parallel to the treated surfaces and the dye solution is supplied. By switching the dye solution supply direction, the processing time may be significantly shortened.

Further, the above-described exemplary embodiments may be partially combined with each other and the same effect may be obtained.

As described above, the present invention may be suitably applied, especially to a step of adsorbing a sensitizing dye into a porous semiconductor in a process of fabricating a dye sensitization solar cell. However, the present invention may be applied to a processing of adsorbing any dye into any porous semiconductor layer or any film formed on a treated surface of a substrate.

DESCRIPTION OF SYMBOLS

10: cassette carrying-in/carrying-out unit
18: transport device
20: dye adsorption unit (dye adsorption apparatus)
26: chuck unit
28: transport driving unit
30: processing tank
32: boat
34: boat transport unit
36: top cover
38a, 38b, 38c: holding unit
44: lift arm
46: electromagnet
72: top cover operating unit
80: first dye solution supply unit
82: second dye solution supply unit
84: first flow control unit
86: second flow control unit
88L: left upper port
88R: right upper port
90L: left lower port
90R: right lower port
98, 100: support unit
104: body protrusion
106: cover protrusion
170: controller

What is claimed is:

1. A dye adsorption apparatus of adsorbing a dye into a porous semiconductor layer formed on a treated surface of a substrate, the apparatus comprising:
    a boat configured to detachably hold a plurality of substrates which are arranged in a row such that the treated surfaces of the substrates face horizontally;
    a processing tank configured to accommodate the boat and the plurality of substrates held in the boat to be capable of going in and out of the processing tank through a top opening;
    a top cover configured to close the top opening of the processing tank;
    a first transport unit configured to transport the boat into and out of the processing tank;
    a dye solution supply unit configured to supply a dye solution formed by solving the dye in a solvent into the processing tank to such an extent that the plurality of substrates held in the boat are sunk in the dye solution within the processing tank; and
    a flow control unit configured to control a flow of the dye solution within the processing tank during a dye adsorption processing.

2. The dye adsorption apparatus of claim 1, wherein, during the processing, pressure on the surface of the dye solution in the processing tank covered by the top cover is higher than atmospheric pressure.

3. The dye adsorption apparatus of claim 1, wherein, during the processing, the inside of the processing tank covered by the top cover is filled with the dye solution without a gap.

4. The dye adsorption apparatus of claim 1, wherein the processing tank is provided with at least one first port and at least one second port,
    the dye solution supply unit supplies the dye solution to the processing tank at least one of the first port and the second port, and
    the flow control unit controls the flow of the dye solution using the first port and the second port.

5. The dye adsorption apparatus of claim 4, wherein the flow control unit circulates the dye solution between the inside and outside of the processing tank.

6. The dye adsorption apparatus of claim 4, wherein the dye solution supply unit substitutes old dye solution to new dye solution within the processing tank using the first port and the second port.

7. The dye adsorption apparatus of claim 4, wherein the flow control unit controls the flow of the dye solution while substituting old dye solution with new dye solution within the processing tank using the first port and the second port.

8. The dye adsorption of claim 4, wherein the processing tank is provided with a third port for use in discharging the dye solution,
    the dye solution supply unit substitutes old dye solution with new dye solution within the processing tank using at least one of the first port and the second port, and the third port, and
    the flow control unit controls the flow of the dye solution while substituting old dye solution with new dye solution within the processing tank using at least one of the first port and the second port and the third port.

9. The dye adsorption apparatus of claim 1, wherein, during the dye adsorption processing, the flow control unit switches or varies the flow direction of the dye solution.

10. The dye adsorption apparatus of claim 1, wherein, during the dye adsorption processing, the flow control unit various the flow rate of the dye solution.

11. The dye adsorption apparatus of claim 1, wherein, during the dye adsorption processing, the flow control unit varies the pressure within the processing tank.

12. The dye adsorption apparatus of claim 1, wherein a flow suppressing section is provided to suppress the flow of the dye solution along the rear surface of each of the substrates within the processing tank.

13. The dye adsorption apparatus of claim 12, wherein the flow suppressing section includes a plurality of flow suppressing members which are arranged in a row with a spacing corresponding to that of the plurality of substrates arranged in a row and held on the boat, and provided in the processing tank, and each flow suppressing member suppresses the flow of the dye solution along the rear surface of a substrate corresponding to the flow suppressing member.

14. The dye adsorption apparatus of claim 1, wherein, on the boat, the plurality of substrates are arranged such that the treated surfaces of each pair of adjacent substrates are opposed to each other.

15. The dye adsorption apparatus of claim 1, wherein the first transport unit includes an arm detachably coupled to the boat,
the arm breaks away from the arm while the boat is being accommodated in the processing tank together with the plurality of substrates for a dye adsorption processing, and
when the boat is transported in the outside of the processing tank, or transported into or out of the processing tank, the arm is coupled to the boat.

16. The dye adsorption apparatus of claim 1, wherein first transport unit includes an arm integrally coupled to the boat,
the top cover is fixed to the arm, and
the top cover closes the top opening of the processing tank the arm while the boat is being accommodated in the processing tank together with the plurality of substrates for the dye adsorption processing.

17. The dye adsorption apparatus of claim 1, further comprising a second transport unit which performs exchange of the plurality of substrates with the first transport unit.

18. A dye adsorption apparatus of adsorbing a dye into a porous semiconductor layer formed on a treated surface of a substrate, the apparatus comprising:
a processing tank configured to accommodate a plurality of substrates which are arranged in a row such that the treated surfaces thereof are parallel to each other;
a top cover configured to close a top opening of the tank;
a first transport unit configured to transport the plurality of substrates into or out of the processing tank; and
a dye solution supply unit configured to supply a dye solution formed by solving the dye in a solvent into the processing tank to such an extent that the plurality of substrates held in the boat are sunk in the dye solution within the processing tank,
wherein, during a dye solution processing, a flow direction of the dye solution within the processing tank is switched by the dye solution unit.

19. A dye adsorption apparatus of adsorbing a dye into a porous semiconductor layer formed on a treated surface of a substrate, the apparatus comprising:
a processing tank configured to accommodate a plurality of substrates which are arranged in a row such that the treated surfaces thereof are parallel to each other;
a top cover configured to close a top opening of the processing tank;
a first transport unit configured to transport the plurality of substrates into and out of the processing tank;
a dye solution supply unit configured to supply a dye solution formed by solving the dye in a solvent into the processing tank to such an extent that the plurality of substrates held in the boat are sunk in the dye solution within the processing tank; and a flow control unit configured to switch a flow direction of the dye solution within the processing tank during a dye adsorption processing.

20. A dye adsorption method of adsorbing a dye into a porous semiconductor layer formed on a treated surface of a substrate, the method comprising:
a first step of arranging a plurality of substrates in a row such that the treated surfaces are parallel to each other and introducing the plurality of substrates into the processing tank;
a second step of supplying a dye solution formed by solving the dye in a solvent into the processing tank in a first direction parallel to the treated surfaces; and
a third step of switching to a second direction which is different from the first direction and parallel to the treated surfaces and supplying the dye solution.

* * * * *